(12) United States Patent
Yoshimizu et al.

(10) Patent No.: US 11,889,698 B2
(45) Date of Patent: Jan. 30, 2024

(54) SEMICONDUCTOR STORAGE DEVICE AND METHOD FOR MANUFACTURING SEMICONDUCTOR STORAGE DEVICE

(71) Applicant: KIOXIA CORPORATION, Tokyo (JP)

(72) Inventors: Yasuhito Yoshimizu, Yokkaichi Mie (JP); Hiroshi Nakaki, Yokkaichi Mie (JP); Kazuaki Nakajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 238 days.

(21) Appl. No.: 17/190,348

(22) Filed: Mar. 2, 2021

(65) Prior Publication Data

US 2022/0085036 A1 Mar. 17, 2022

(30) Foreign Application Priority Data

Sep. 14, 2020 (JP) ................................. 2020-153733

(51) Int. Cl.
*H10B 43/35* (2023.01)
*H01L 23/00* (2006.01)
(Continued)

(52) U.S. Cl.
CPC ............. *H10B 43/35* (2023.02); *H01L 24/46* (2013.01); *H10B 41/10* (2023.02); *H10B 41/20* (2023.02);
(Continued)

(58) Field of Classification Search
CPC ........ H10B 43/35; H10B 41/10; H10B 41/20; H10B 41/23; H10B 41/35; H10B 43/10;
(Continued)

(56) References Cited

U.S. PATENT DOCUMENTS 7,910,432 B2   3/2011  Tanaka et al.
2020/0286910 A1*  9/2020  Kashima ................ H10B 41/35
(Continued)

OTHER PUBLICATIONS

Naito et al. "World's first monolithic 3D-FPGA with TFT SRAM over 90nm 9 layer Cu CMOS" Published in 2010 Symposium on VLSI Technology, 2010.

*Primary Examiner* — Shahed Ahmed
*Assistant Examiner* — Khatib A Rahman
(74) *Attorney, Agent, or Firm* — Kim & Stewart LLP

(57) ABSTRACT

A semiconductor storage device includes first wiring layers stacked along a first direction, a first pillar including a first semiconductor layer and extending along the first direction through the first wiring layers, a second wiring layer disposed above the first pillar in the first direction and extending along a second direction perpendicular to the first direction, a semiconductor-containing layer including a first portion disposed on an upper end of the first pillar in the first direction, a second portion contacting the first portion and formed along the second wiring layer, and a third portion contacting an upper end of the second portion and extending along a third direction perpendicular to the first direction and crossing the second direction, and a first insulating layer between each of the first and second portions of the semiconductor-containing layer and the second wiring layer. An upper surface of the third portion contains a metal.

8 Claims, 21 Drawing Sheets

(51) Int. Cl.
    *H10B 41/10*     (2023.01)
    *H10B 41/20*     (2023.01)
    *H10B 41/35*     (2023.01)
    *H10B 43/10*     (2023.01)
    *H10B 43/20*     (2023.01)

(52) U.S. Cl.
    CPC ............. *H10B 41/35* (2023.02); *H10B 43/10* (2023.02); *H10B 43/20* (2023.02)

(58) Field of Classification Search
    CPC ........ H10B 43/20; H10B 43/27; H10B 41/27; H10B 41/30; H10B 41/41; H10B 41/42; H10B 43/40; H01L 27/1157; H01L 24/46; H01L 27/11519; H01L 27/11551; H01L 27/11553; H01L 27/11524; H01L 27/11565; H01L 27/11578; H01L 27/11556; H01L 27/11582; H01L 27/11521; H01L 27/11536; H01L 27/11531; H01L 27/11573
    See application file for complete search history.

(56) References Cited

U.S. PATENT DOCUMENTS

2020/0402999 A1     12/2020   Nakaki
2021/0050360 A1*   2/2021   Kai ........................ G11C 5/063

* cited by examiner

SEMICONDUCTOR STORAGE DEVICE AND METHOD FOR MANUFACTURING SEMICONDUCTOR STORAGE DEVICE

CROSS-REFERENCE TO RELATED APPLICATION

This application is based upon and claims the benefit of priority from Japanese Patent Application No. 2020-153733, filed on Sep. 14, 2020, the entire contents of which are incorporated herein by reference.

FIELD

Embodiments described herein relate generally to semiconductor storage devices and methods for manufacturing the semiconductor storage devices.

BACKGROUND

A NAND flash memory in which memory cells are three-dimensionally stacked is known.

DETAILED DESCRIPTION

Figure 1:
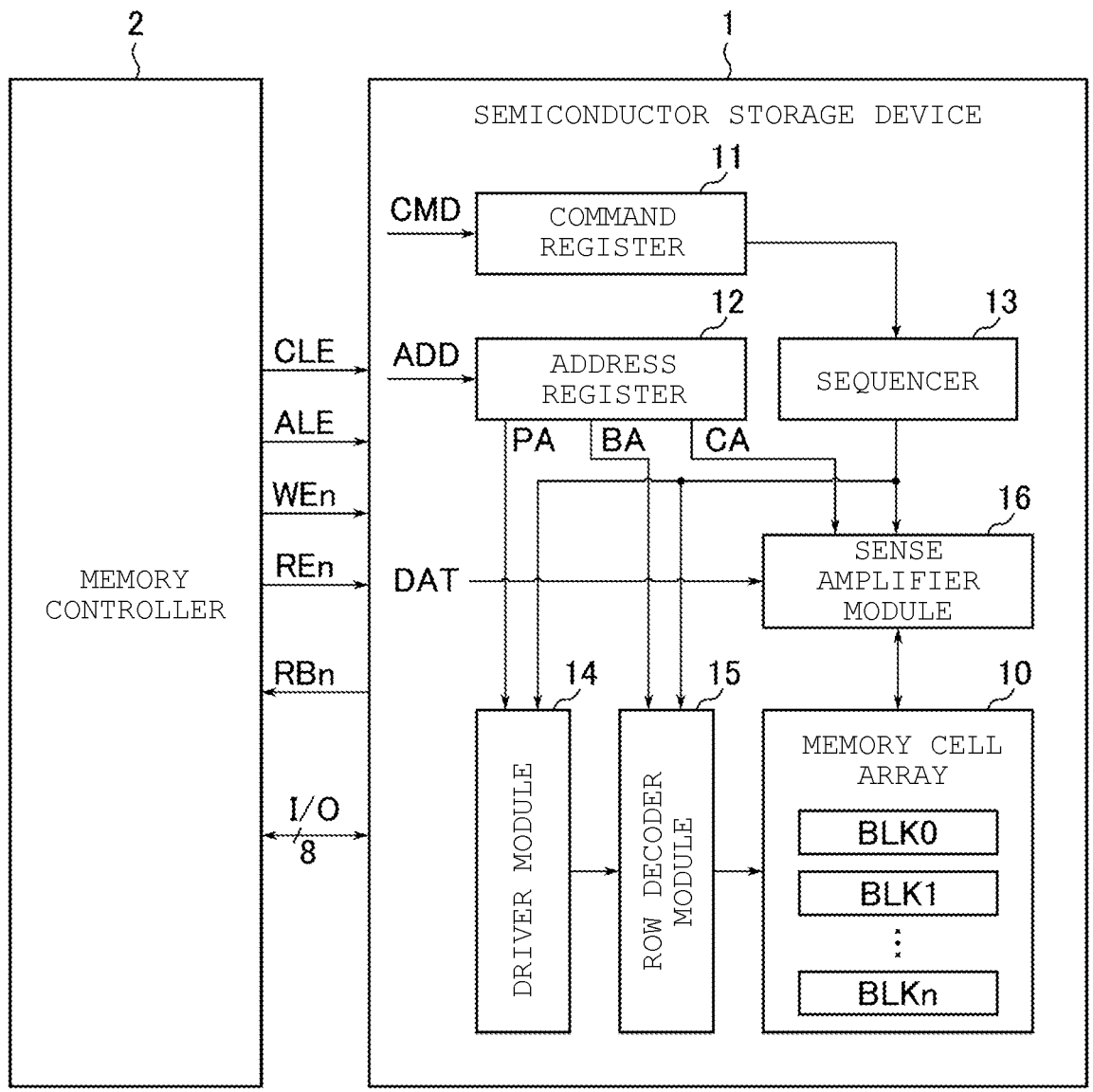
FIG. 1 is a block diagram illustrating a circuit configuration of a semiconductor storage device according to a first embodiment.

Embodiments provide a semiconductor storage device having a low channel contact resistance.

In general, according to one embodiment, a semiconductor storage device includes a plurality of first wiring layers stacked along a first direction, a first pillar including a first semiconductor layer and extending along the first direction through the plurality of first wiring layers, a second wiring layer disposed above the first pillar in the first direction and extending along a second direction perpendicular to the first direction, and a semiconductor-containing layer. The semiconductor-containing layer includes a first portion disposed on an upper end of the first pillar in the first direction, a second portion contacting the first portion and formed along the second wiring layer, and a third portion contacting an upper end of the second portion and extending along a third direction perpendicular to the first direction and crossing the second direction. The semiconductor storage device further includes a first insulating layer between each of the first and second portions of the semiconductor-containing layer and the second wiring layer. At least an upper surface of the third portion contains a metal.

Hereinafter, semiconductor storage devices according to certain example embodiments will be described with reference to the drawings. In the following description, components having the same or similar functions are denoted by the same reference numerals. Additional description of repeated components may be omitted after an initial explanation. The drawings are schematic or conceptual, and the depicted relationships between the thickness and width of each component, the ratio of the sizes between different components, and the like are not always the same as the actual component. In this specification, the term a "connection" is not limited to the case of being physically connected, but also includes the case of being electrically connected. In this specification, "extending in or along a direction" denotes that, for example, the dimension in the direction of a component is larger than the smallest dimension among the sizes of the component in an X direction, a Y direction, and a Z direction described later.

The X direction, the Y direction, and the Z direction are defined for descriptive convenience as follows. The X direction and the Y direction are directions substantially parallel to a surface of a semiconductor substrate 20 (refer to FIG. 4). The Y direction is a direction along which a slit SLT extends. The X direction is a direction intersecting (for example, being substantially perpendicular to) the Y direction. The Z direction is a direction intersecting the X direction and the Y direction (for example, substantially perpendicularly) and going away from the semiconductor substrate 20. However, these expressions are only for the descriptive convenience and do not necessarily reference to the direction of gravity. In this disclosure, the Z direction can also be referred to as the "first direction".

First Embodiment

FIG. 1 is a block diagram illustrating a system configuration of a semiconductor storage device 1. The semiconductor storage device 1 is a nonvolatile semiconductor storage device such as a NAND flash memory. The semiconductor storage device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of 1 or more). The block BLK is a set of nonvolatile memory cell transistors MC0 to MC7 (refer to FIG. 2). The memory cell array 10 has a plurality of bit lines and a plurality of word lines. Each of the memory cell transistors MC0 to MC7 is connected to one bit line and one word line. When each of the memory cell transistors MC0 to MC7 does not need to be particularly distinguished, the memory cell transistor may be referred to as a memory cell transistor MC. The detailed configuration of the memory cell array 10 will be described later.

The command register 11 stores a command CMD received by the semiconductor storage device 1 from a memory controller 2. The command CMD includes, for example, an instruction for allowing the sequencer 13 to execute a read operation, a write operation, an erase operation, and the like.

The address register 12 stores address information ADD received by the semiconductor storage device 1 from the memory controller 2. The address information ADD includes, for example, a block address BA, a page address PA, and a column address CA. For example, the block address BA, the page address PA, and the column address CA are used to select a block BLK, a word line, and a bit line, respectively.

The sequencer 13 is a circuit configured to control the entire operations of the semiconductor storage device 1. For example, the sequencer 13 controls the driver module 14, the row decoder module 15, the sense amplifier module 16, and the like based on the command CMD stored in the command register 11 to execute the read operation, the write operation, the erase operation, and the like.

The driver module 14 is a circuit configured to generate a voltage used in the read operation, the write operation, the erase operation, and the like. Then, the driver module 14 applies the generated voltage to a signal line corresponding to a word line selected based on, for example, a page address PA stored in the address register 12.

The row decoder module 15 is a circuit configured to select one block BLK in the corresponding memory cell array 10 based on a block address BA stored in the address register 12. Then, the row decoder module 15 applies, for example, the voltage applied to the signal line by the driver module to the selected word line in the selected block BLK.

In the write operation, the sense amplifier module 16 applies the voltage to each bit line according to write data DAT received from the memory controller 2. In addition, in the read operation, the sense amplifier module 16 determines the data stored in the memory cell based on the voltage of the bit line and transmits the determination result as read data DAT to the memory controller 2.

Communication between the semiconductor storage device 1 and the memory controller 2 conforms to, for example, a NAND interface standard. For example, in the communication between the semiconductor storage device 1 and the memory controller 2, a command latch enable signal CLE, an address latch enable signal ALE, a write enable signal WEn, a read enable signal REn, a ready/busy signal RBn, and the input/output signal I/O are used.

The input/output signal I/O is, for example, an 8-bit length signal and may include the command CMD, the address information ADD, the data DAT, and the like.

The command latch enable signal CLE is a signal indicating that the input/output signal I/O received by the semiconductor storage device 1 is a command CMD.

The address latch enable signal ALE is a signal indicating that the signal I/O received by the semiconductor storage device 1 is address information ADD.

The write enable signal WEn is a signal that instructs the semiconductor storage device 1 to input the input/output signal I/O.

The read enable signal REn is a signal that instructs the semiconductor storage device 1 to output the input/output signal I/O.

The ready/busy signal RBn is a signal that notifies the memory controller 2 of whether the semiconductor storage device 1 is in a ready state for accepting an instruction from the memory controller 2 or a busy state for not accepting an instruction.

The semiconductor storage device 1 and the memory controller 2 described above may make up one semiconductor device. As the semiconductor device, a memory card such as an SD card or a solid state drive (SSD) may be exemplified.

Next, the electrical configuration of the memory cell array 10 will be described.

Figure 2:
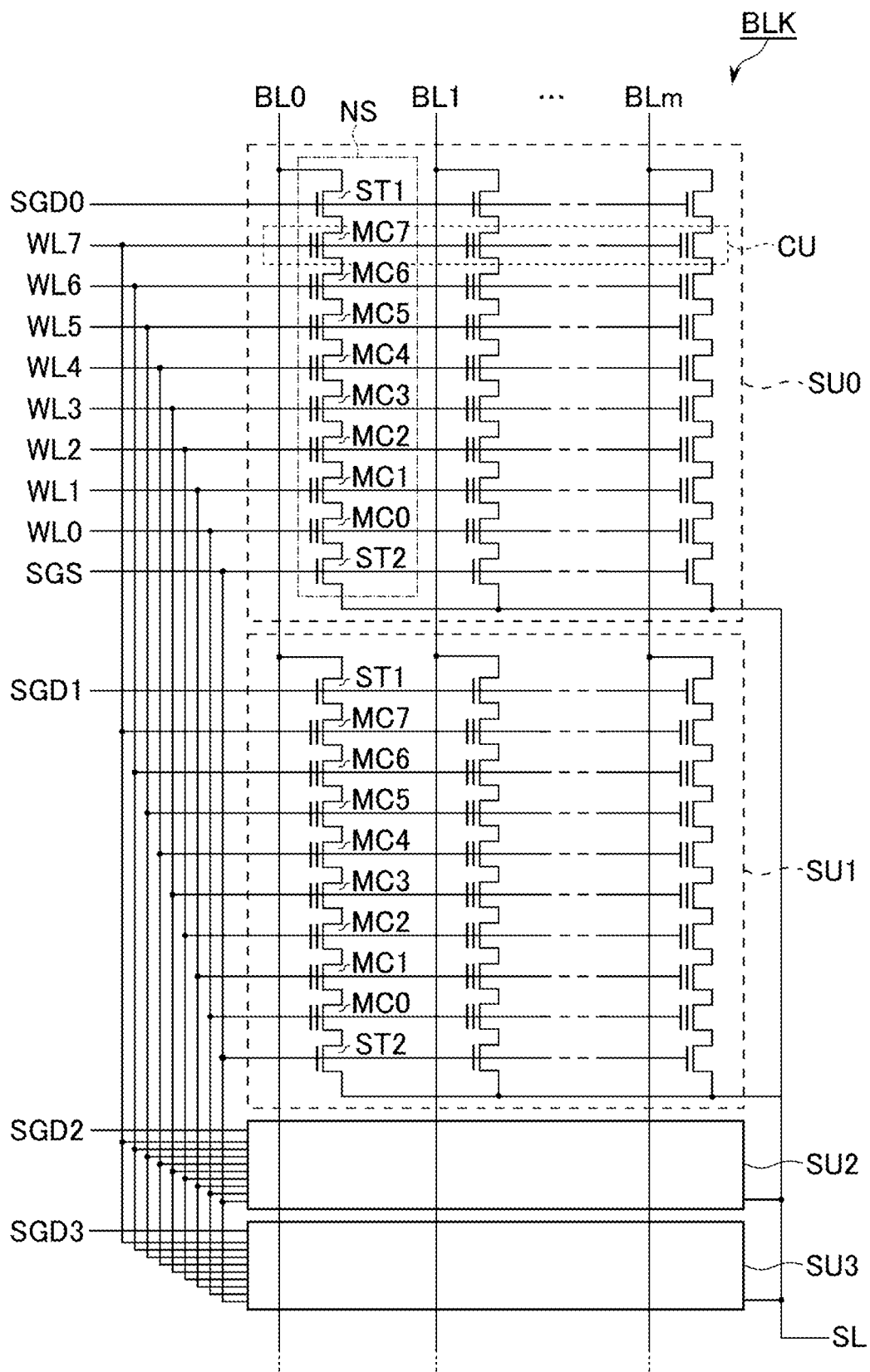
FIG. 2 is a circuit diagram of a memory cell array of a semiconductor storage device according to a first embodiment.

FIG. 2 is a diagram illustrating an equivalent circuit of the memory cell array 10. Here, only one block BLK is extracted for illustration purpose. The block BLK includes a plurality of (for example, four) string units SU0 to SU3.

Each of the plurality of NAND strings NS is associated with bit lines BL0 to BLm (m is an integer of 1 or more). Each of the NAND strings NS includes, for example, the memory cell transistors MC0 to MC7 and select transistors ST1 and ST2.

The memory cell transistor MC includes a control gate and a charge storage layer and stores data in a nonvolatile manner. Each of the select transistors ST1 and ST2 is used to select the string unit SU during various operations.

The memory cell transistor MC may be a metal-oxide-nitride-oxide-semiconductor (MONOS) type in which an insulating film is used for the charge storage layer or an FG type in which a conductive layer is used for the charge storage layer. Hereinafter, the MONOS type will be described as an example.

In each of the NAND strings NS, a drain of the select transistor ST1 is connected to the associated bit line BL, and a source of the select transistor ST1 is connected to one end of the memory cell transistors MC0 to MC7 connected in series. In the same block BLK, gates of the select transistors ST1 in the string units SU0 to SU3 are commonly connected to select gate lines SGD0 to SGD3, respectively. The select gate lines SGD0 to SGD3 are connected to the row decoder module 15.

In each of the NAND strings NS, a drain of the select transistor ST2 is connected to the other end of the memory cell transistors MC0 to MC7 connected in series. In the same block BLK, a source of the select transistor ST2 is commonly connected to a source line SL, and a gate of the select transistor ST2 is commonly connected to a select gate line SGS. The select gate line SGS is connected to the row decoder module 15.

The bit line BL commonly connects one NAND string NS in each of the string units SU0 to SU3 in each block BLK. The source line SL is commonly connected, for example, between the plurality of blocks BLK.

A set of the plurality of memory cell transistors MC connected to a common word line WL in one string unit SU is referred to as, for example, a cell unit CU. For example, the storage capacity of the cell unit CU including the memory cell transistors MC each of which stores 1-bit data is defined as "one-page data". The cell unit CU may have a storage capacity of two-page data or more according to the number of bits of data stored in the memory cell transistor MC.

Furthermore, the circuit configuration of the memory cell array 10 in the semiconductor storage device 1 is not limited to the configuration described above. For example, the number of memory cell transistors MC and the select transistors ST1 and ST2 in each NAND string NS may be any number. The number of string units SU in each block BLK may be any number.

Figure 3:
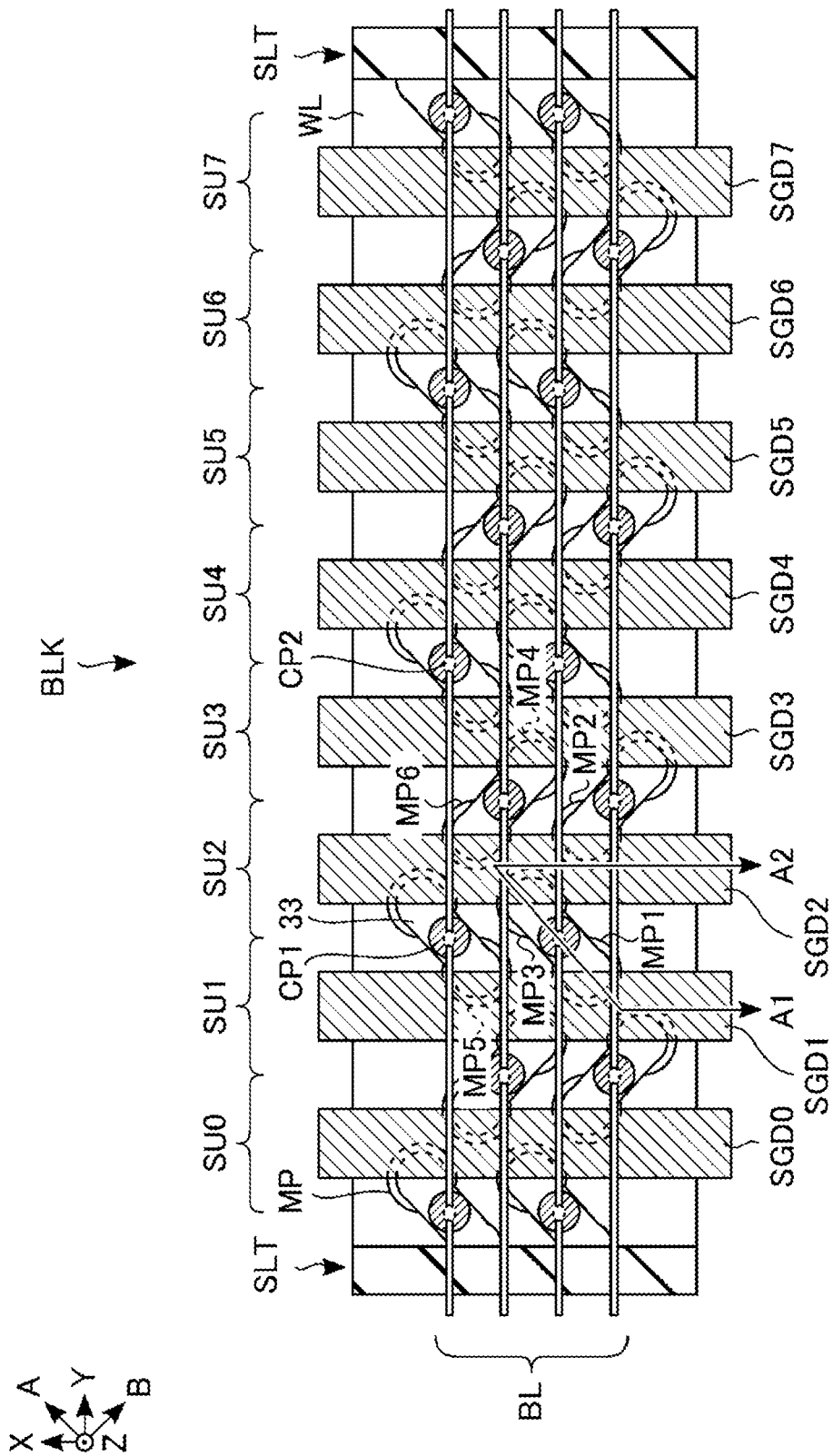
FIG. 3 is a plan view of a memory cell array of a semiconductor storage device according to a first embodiment.

FIG. 3 is a plan view of the memory cell array 10 in the semiconductor storage device 1. FIG. 3 is a plan view of one block BLK. Here, eight string units SU0 to SU7 are provided in one block BLK. Furthermore, some parts of the insulating layer are omitted from the drawings for purposes of description.

As illustrated in FIG. 3, the slit SLT is on each of the two side surfaces of the word line WL in the Y direction. The slit SLT extends along the X direction. In an embodiment, the select gate line SGS and the word lines WL0 to WL7 are sequentially stacked on the semiconductor substrate 20 (refer to FIG. 4). Then, the slit SLT separates, for example, the select gate line SGS and the word line WL for each block BLK.

As illustrated in FIG. 3, the string units SU0 to SU7 are arranged, for example, along the Y direction. Each of the string units SU has a plurality of memory pillars MP. When the string units SU0 to SU7 are not being distinguished from one another in the description, the string units may be referred to as string units SU.

The memory pillar MP corresponds to the NAND string NS. The memory pillar MP has the memory cell transistors MC0 to MC7 and the select transistors ST2 in the NAND string NS. The memory pillar MP penetrates or passes through the select gate line SGS and the word lines WL0 to WL7 and extends along the Z direction. The details of the structure of the memory pillar MP will be described later.

For example, each string unit SU has two memory pillar groups arranged along the Y direction. In each string unit SU, the plurality of memory pillars MP are arranged in a zigzag manner in the X direction. One block BLK has a group of 16 rows of memory pillars extending along the X direction and arranged in the Y direction.

For example, a memory pillar MP1 of the string unit SU1 and a memory pillar MP2 of the string unit SU2 are adjacent to each other in the Y direction. A memory pillar MP3 of the string unit SU2 and a memory pillar MP4 of the string unit SU3 are adjacent to each other in the Y direction. A memory pillar MP5 of the string unit SU1 and a memory pillar MP6 of the string unit SU2 are adjacent to each other in the Y direction. The memory pillar MP1 and the memory pillar MP5 are adjacent to each other in the X direction, and the memory pillar MP2 and the memory pillar MP6 are adjacent to each other in the X direction. In the X direction, the memory pillars MP3 and MP4 are disposed between the memory pillars MP1 (and MP2) and the memory pillars MP5 (and MP6). In the Y direction, the memory pillar MP3 is disposed between the memory pillar MP1 (and MP5) and the memory pillar MP2 (and MP6). In addition, in the Y direction, the memory pillars MP2 and MP6 are disposed between the memory pillars MP3 and the memory pillars MP4. Furthermore, an array of the memory pillars MP may be set in any manner.

The select transistor ST1 is on each memory pillar MP. Then, the gates of the plurality of select transistors ST1 of each string unit SU are commonly connected to the select gate line SGD. When the select gate lines SDG0 to SDG7 are not being distinguished from one another in the description, the select gate lines may be referred to as a select gate line SGD. In the example of FIG. 3, each of the select gate lines SGD is between the memory pillars MP adjacent in the Y direction and extends along the X direction. For example, in the string unit SU2, the select gate line SGD2 extends along the X direction between the select transistor ST1 on the memory pillar MP3 and the select transistor ST1 on the memory pillar MP2 (and MP6).

In the following description, for example, in the XY plane substantially parallel to the semiconductor substrate, the direction connecting the center of the memory pillar MP1 with the center of the memory pillar MP2 is notated as an A direction, and the direction connecting the center of the memory pillar MP6 with the center of the memory pillar MP4 is notated as a B direction. The A direction is a direction that is substantially parallel to the semiconductor substrate and is different from the X direction and the Y direction. The B direction is a direction that is substantially parallel to the semiconductor substrate and intersects the A direction.

In an embodiment, in the two adjacent string units SU, the select transistors ST1 of the two memory pillars MP adjacent to each other in the A direction or the B direction are commonly connected to one bit line BL via contact plugs CP1 and CP2. In other words, the two select transistors ST1 that are provided between the two select gate lines SGD and adjacent to each other in the A direction or the B direction are commonly connected to one contact plug CP1.

For example, a semiconductor-containing layer 33 of the memory pillar MP1 of the string unit SU1 and the semiconductor-containing layer 33 of the memory pillar MP3 of the string unit SU2 adjacent to each other in the A direction are connected to one contact plug CP1. Similarly, for example, the semiconductor-containing layer 33 of the memory pillar MP6 of the string unit SU2 and the semiconductor-containing layer 33 of the memory pillar MP4 of the string unit SU3 adjacent to each other in the B direction are connected to one contact plug CP1.

The contact plug CP2 is provided on the contact plug CP1. The contact plug CP2 connects any of the plurality of bit lines BL extending along the Y direction with the contact plug CP1.

Figure 4:
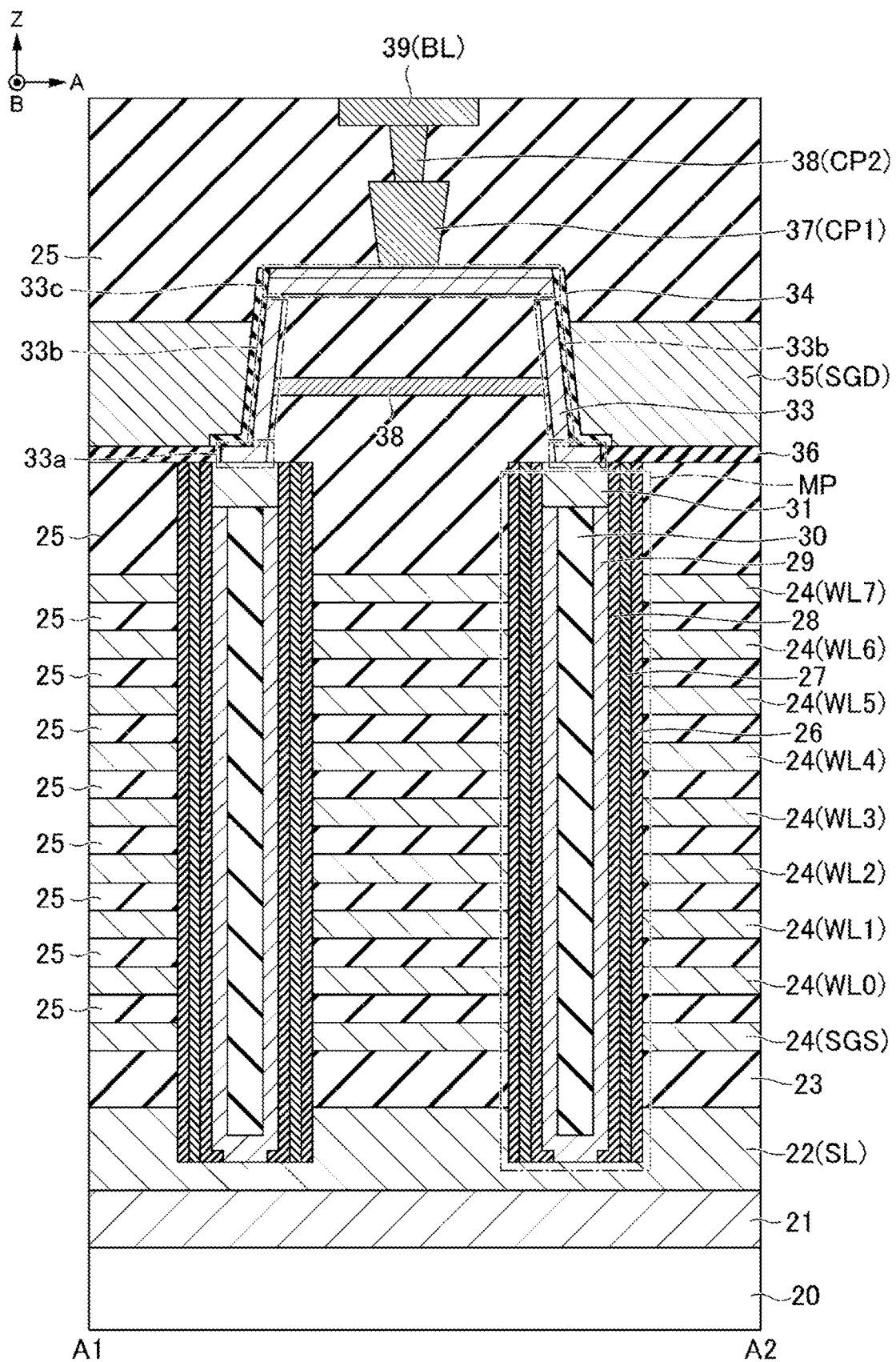
FIG. 4 is a cross-sectional view of a memory cell array of a semiconductor storage device according to a first embodiment.

FIG. 4 is a cross-sectional view of the memory cell array 10 in the semiconductor storage device 1. FIG. 4 is a cross-sectional view taken along the line A1-A2 of FIG. 3.

As illustrated in FIG. 4, an insulating layer 21 is formed on the semiconductor substrate 20. The insulating layer 21 is formed by, for example, a silicon oxide film ($SiO_2$). Furthermore, a circuit such as the row decoder module 15 or the sense amplifier module 16 may be provided in the region where the insulating layer 21 is formed, that is, between the semiconductor substrate 20 and a wiring layer 22.

The wiring layer 22 extending along the X direction and functioning as a source line SL is formed on the insulating layer 21. The wiring layer 22 is made of a conductive material, for example, an n-type semiconductor, a p-type semiconductor, or a metal material.

An insulating layer 23 is formed on the wiring layer 22. The insulating layer 23 is made of, for example, $SiO_2$.

A nine-layered wiring layer 24 that functions as the select gate line SGS and word lines WL0 to WL7 and a nine-layered insulating layer 25 are alternately stacked on the insulating layer 23 from the lower layer. The insulating layer 25 is between the adjacent wiring layers 24.

The wiring layer 24 is made of a conductive material, for example, an n-type semiconductor, a p-type semiconductor, or a metal material. Here, a stacked structure of titanium nitride (TiN) and tungsten (W) is used as the wiring layer 24. Titanium nitride (TiN) has a function as a barrier layer for preventing a reaction between W and $SiO_2$ or as an adhesion layer for improving the adhesion of W when a film of W is formed by chemical vapor deposition (CVD). In addition, the insulating layer 25 includes, for example, $SiO_2$.

The memory pillar MP is in the stacked body of the wiring layer 24 and the insulating layer 25. The bottom surface of the memory pillar MP penetrates the nine-layered wiring layer 24 and reaches the wiring layer 22. The memory pillar MP includes a block insulating film 26, a charge storage layer 27, a tunnel insulating film 28, a semiconductor layer 29, a core layer 30, and a cap layer 31.

The memory pillar MP is in a hole that penetrates the plurality of wiring layers 24 and the plurality of insulating layers 25, and its bottom surface reaches the wiring layer 22. The block insulating film 26, the charge storage layer 27, and the tunnel insulating film 28 are stacked in this order from the inner peripheral surface of the hole toward the inner side. The side surface of the semiconductor layer 29 is in contact with the tunnel insulating film 28, and the bottom surface of the semiconductor layer 29 is in contact with the wiring layer 22. The semiconductor layer 29 is a region where channels of the select transistor ST2 and the memory cell transistor MC are formed. The semiconductor layer 29 functions as a signal line connecting the current paths of the select transistor ST2 and the memory cell transistors MC0 to MC7. The core layer 30 is located inside the semiconductor layer 29. The cap layer 31 of which side surface is in contact with the tunnel insulating film 28 is on the semiconductor layer 29 and the core layer 30, and the memory pillar MP includes the semiconductor layer 29 penetrating the inner portions of the plurality of wiring layers 24 and extending along the Z direction.

The block insulating film 26, the tunnel insulating film 28, and the core layer 30 are made of, for example, $SiO_2$. The charge storage layer 27 is, for example, a silicon nitride film (SiN). The semiconductor layer 29 and the cap layer 31 are made of, for example, polysilicon.

Each of the memory cell transistors MC0 to MC7 is formed by the memory pillar MP and the eight-layered wiring layer 24 functioning as each of the word lines WL0 to WL7. Similarly, the select transistor ST2 is formed by the memory pillar MP and the wiring layer 24 functioning as the select gate line SGS.

Above the memory pillar MP, the select transistor ST1 is formed by the semiconductor-containing layer 33, an insulating layer 34, and a wiring layer 35. The channel region of the select transistor ST1 is a first layer 33a and a second layer 33b of the semiconductor-containing layer 33 along the side surface and the bottom surface of the wiring layer 35.

The semiconductor-containing layer 33 has the first layer 33a, the second layer 33b, and a third layer 33c. The semiconductor-containing layer 33 electrically connects a conductor 37 described later with the semiconductor layer 29.

The first layer 33a extends along any direction in the XY plane. The first layer 33a extends in, for example, the Y direction. The first layer 33a is between an upper end of the semiconductor layer 29 and a bottom surface of the wiring layer 35. As illustrated in FIG. 4, the cap layer 31 may be between the semiconductor layer 29 and the first layer 33a. The second layer 33b connects the first layer 33a with the third layer 33c. The second layer 33b extends from the first layer 33a along the substantially Z direction. The second layer 33b is formed along the side surface of the wiring layer 35. The third layer 33c is in contact with the upper end of the second layer 33b and extends along any direction in the XY plane. The third layer 33c extends along, for example, the A direction or the B direction. The third layer 33c is above the upper surface of the wiring layer 35. The third layer 33c connects the two second layers 33b that are in contact with the two memory pillars MP adjacent to each other in the A direction or the B direction. The third layer 33c connects the two adjacent select transistors ST1. The first layer 33a and the second layer 33b are made of, for example, polysilicon or amorphous silicon.

Figure 5:
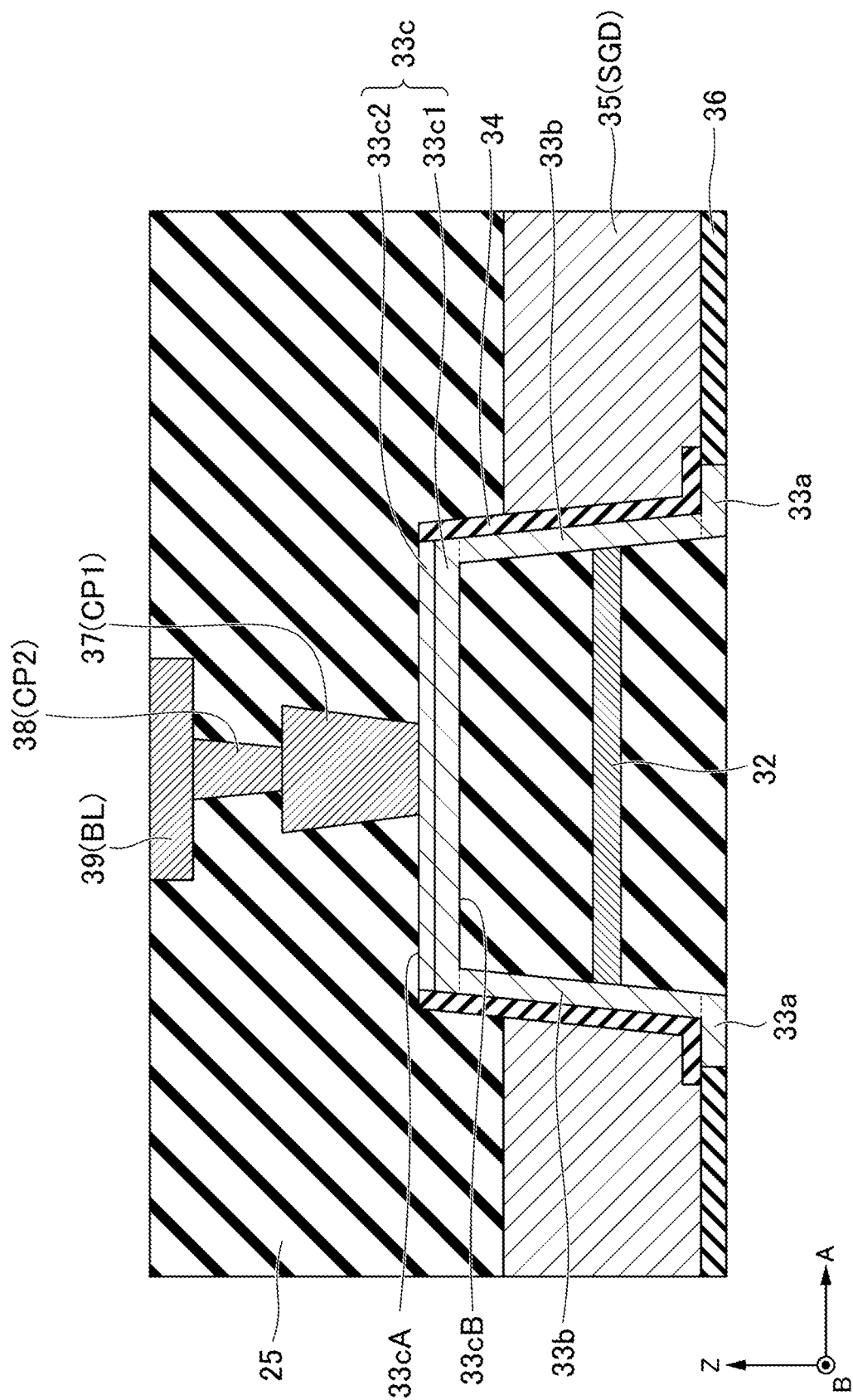
FIG. 5 is a cross-sectional view of a memory cell array of a semiconductor storage device according to a first embodiment.

FIG. 5 is a cross-sectional view of the memory cell array 10 in the semiconductor storage device 1. FIG. 5 is an enlarged view of the semiconductor-containing layer 33 of FIG. 4. An upper surface 33cA of the third layer 33c further contains a metal in addition to a semiconductor material. The upper surface 33cA of the third layer 33c is made of, for example, a silicide. The silicide is a compound of silicon and a metal. The metal forming the silicide is, for example, nickel or cobalt. As illustrated in FIG. 5, the third layer 33c has, for example, a first region 33c1 and a second region 33c2. The second region 33c2 is above the first region 33c1 in the Z direction. The first region 33c1 is made of polysilicon or amorphous silicon, and the second region 33c2 is made of a silicide.

The thickness of the third layer 33c is, for example, larger than the thickness of the second layer 33b. The thickness is a length of the layer in the direction perpendicular to the plane along which the layer extends. The peripheral length of the upper surface 33cA of the third layer 33c is, for example, equal to or larger than the peripheral length of a lower surface 33cB. When the thickness of the third layer 33c is large, the third layer 33c is prevented from being penetrated when the opening is formed to form the conductor 37. The volume of the semiconductor expands when the semiconductor is combined with a metal (for example, silicided). The thickness of the third layer 33c becomes larger than the thickness of the second layer 33b due to the combination with the metal. The thickness of the third layer 33c may be allowed to be larger than the thickness of the second layer 33b by selectively growing the semiconductor on the third layer 33c.

The insulating layer 34 is between the semiconductor-containing layer 33 and the wiring layer 35. The insulating layer 34 is formed along the semiconductor-containing layer 33. The insulating layer 34 functions as a gate insulating film of the select transistor ST1. The insulating layer 34 includes, for example, a first portion on the first layer 33a and a second portion on the second layer 33b. That is, the insulating layer 34 has, for example, the first portion extending along the Y direction and the second portion of the second layer 33b extending along the substantially Z direction. The insulating layer 34 is made of, for example, $SiO_2$. Furthermore, the insulating layer 34 may have a stacked structure or, for example, a MONOS structure capable of controlling a threshold value (more specifically, a stacked structure of an insulating layer, a charge storage layer, and an insulating layer).

The wiring layer 35 is above the memory pillar MP. The wiring layer 35 functions as the select gate line SGD. The wiring layer 35 extends along, for example, the X direction. For example, the center position of the wiring layer 35 is different from the center position of the memory pillar MP in the Y direction (see FIG. 6). The wiring layer is disposed above the upper end of the semiconductor layer 29 in the Y direction. The wiring layer 35 is made of a conductive material, for example, an n-type semiconductor, a p-type semiconductor, or a metal material. The wiring layer 35 has, for example, a single-layer structure of W or a stacked structure of TiN/W. The wiring layer 35 may be made of a silicide.

Above the memory pillar MP, an insulating layer 32 extending along the X and Y directions is formed between the layers of the insulating layer 25. The insulating layer 32 functions as an etching stopper when processing a trench TR (that is, a groove pattern). The insulating layer 32 is made of an insulating material that has a high etch selectivity in etching as compared to the insulating layer 25 is used. The insulating layer 32 is made of, for example, SiN. In some examples, the insulating layer 32 may be omitted. The trench TR penetrates the insulating layers 25 and 32 so that the bottom surface thereof reaches the memory pillar MP, and the trench TR extends along the X direction. The wiring layer 35 is formed in the trench TR.

The semiconductor-containing layer 33 and the insulating layer 34 are stacked on the side surface and the bottom surface of the trench TR above the memory pillar MP. An insulating layer 36 is formed in the side surface and the bottom surface of the trench TR excluding the region where the semiconductor-containing layer 33 and the insulating layer 34 are provided and in the region between the upper surfaces of the two trenches TR adjacent to each other in the Y direction. The insulating layer 36 is made of, for example, $SiO_2$. The height of the upper surface of the wiring layer 35 in the Z direction is lower than that of the upper surface of the trench TR (that is, closer to the semiconductor substrate 20). That is, the height of the upper surface of the wiring layer 35 in the Z direction is smaller than that of the upper surfaces of the semiconductor-containing layer 33 and the insulating layer 34. Furthermore, the insulating layer 36 provided in the region between the upper surfaces of the two trenches TR adjacent to each other in the Y direction may be omitted in some examples.

The conductor 37 that functions as a contact plug CP1 is formed on the third layer 33c. The conductor 38 that functions as a contact plug CP2 is formed on the conductor 37. A wiring layer 39 that functions as a bit line BL and extends along the Y direction is formed on the conductor 38. The conductors 37 and 38 and the wiring layer 39 are made of a conductive material, for example, a metal material.

Figure 6:
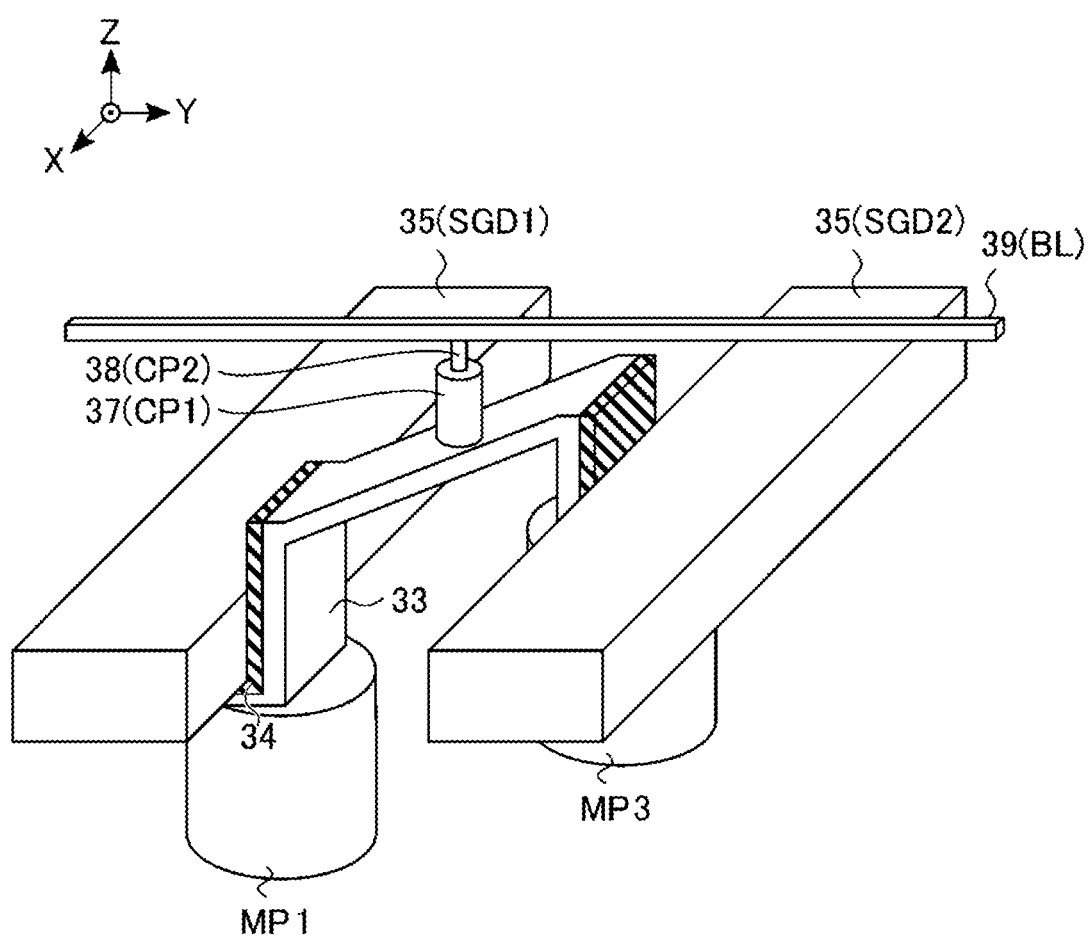
FIG. 6 is a perspective view of a select transistor of a memory cell array of a semiconductor storage device according to a first embodiment.

Next, an example of the arrangement of the select transistor ST1 and the select gate line SGD will be described with reference to FIG. 6. FIG. 6 is a perspective view illustrating the arrangement of the upper portion of the memory pillar MP, the select transistor ST1, the select gate line SGD, the contact plugs CP1 and CP2, and the bit line BL. Furthermore, in the example of FIG. 6, the insulating layer is not fully illustrated for simplifying the description. In addition, the details of the select transistor ST1 are not illustrated.

As illustrated in FIG. 6, for example, the two memory pillars MP1 and MP3 are arranged along a line that is inclined with respect to the X direction and the Y direction. The wiring layer 35 (corresponding to select gate line SGD1) extends along the X direction so as to pass above the memory pillar MP1. Similarly, the wiring layer 35 (corresponding to select gate line SGD2) extends along the X direction so as to pass above the memory pillar MP3. A wiring layer 35 is not provided between the memory pillar MP1 and the memory pillar MP3. The semiconductor-containing layer 33 and the insulating layer 34 are on the memory pillars MP1 and MP3 and between the memory pillar MP1 and the memory pillar MP3. The semiconductor-containing layer 33 is connected to the wiring layer 39 via the conductors 37 and 38. Furthermore, in order to illustrate the connection between the semiconductor-containing layer 33 and the conductor 37, the insulating layer 25 between the memory pillar MP1 and the memory pillar MP3 is omitted from the depiction in FIG. 6.

Next, a method of manufacturing the semiconductor storage device 1 will be described. FIGS. 7 to 18 illustrate a plane of the memory cell array 10 in the manufacturing process and a cross section (a B1-B2 cross section) along the B1-B2 line.

Hereinafter, as a method for forming the wiring layer 24, a method in which a structure corresponding to the wiring layer 24 is formed by initially using a sacrificial layer, and then the sacrificial layer is removed and replaced with a conductive material (corresponding to wiring layer 24) will be described.

Figure 7:
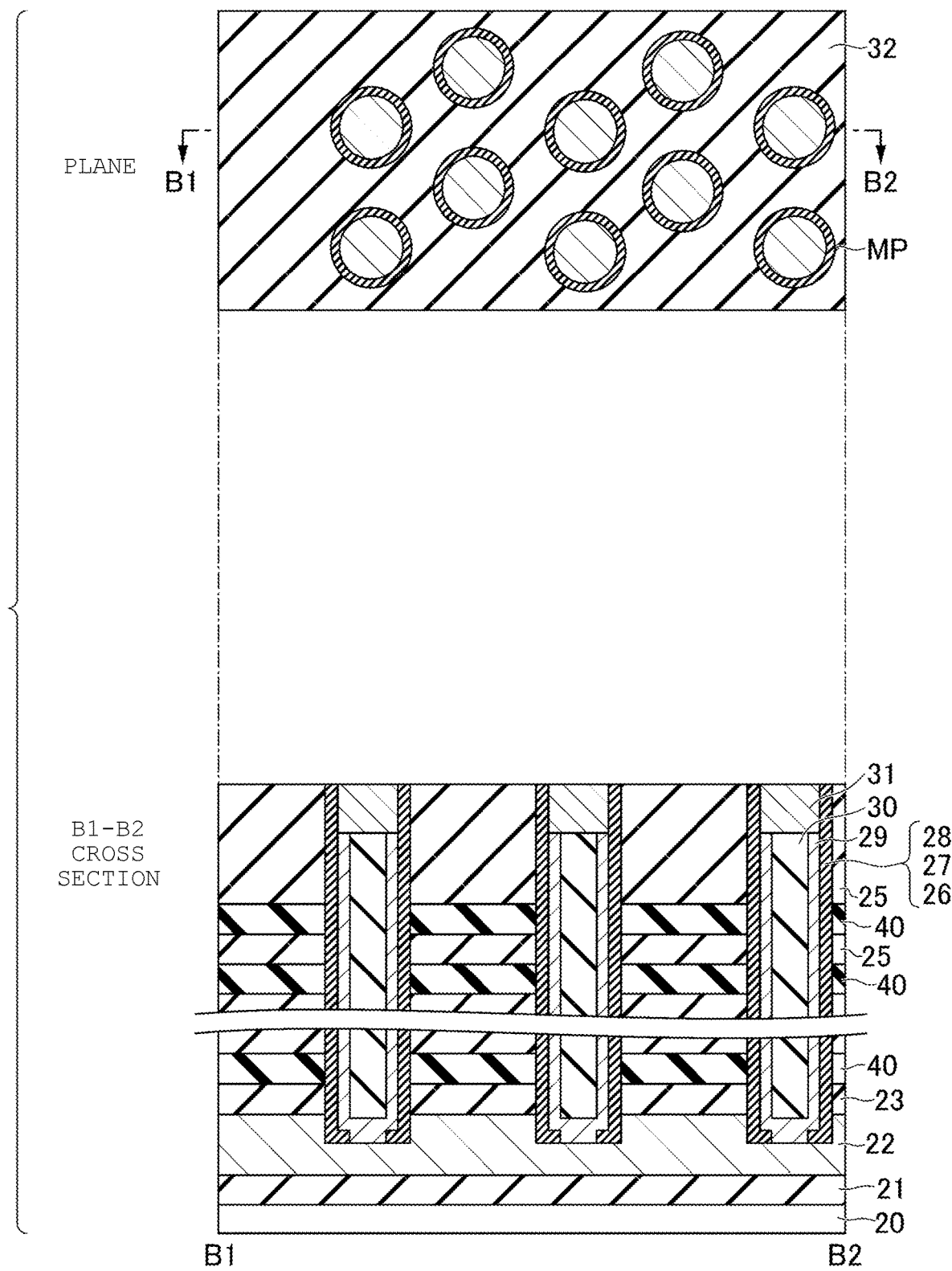
FIGS. 7-18 are diagrams illustrating aspects of a method for manufacturing a semiconductor storage device according to a first embodiment.

As illustrated in FIG. 7, the insulating layer 21, the wiring layer 22, and the insulating layer 23 are sequentially formed on the semiconductor substrate 20. Next, a nine-layered sacrificial layer 40 corresponding to the wiring layer 24 and the nine-layered insulating layer 25 are alternately stacked. For the sacrificial layer 40, a material that has a high etch selectively in wet etching as compared to the insulating layer 25 is used. The sacrificial layer 40 is made of, for example, SiN.

Next, the memory pillar MP is formed. First, a hole which penetrates the nine-layered insulating layer 25, the nine-layered sacrificial layer 40, and the insulating layer 23 and in which the bottom surface reaches the wiring layer is formed. Next, the block insulating film 26, the charge storage layer 27, and the tunnel insulating film 28 are sequentially stacked. After that, the block insulating film 26, the charge storage layer 27, and the tunnel insulating film 28 on the bottom surface of the hole are removed to expose the wiring layer 22 on the bottom surface of the hole. Next, the semiconductor layer 29 and the core layer 30 are formed, and the inner portion of the hole is buried. Next, the semiconductor layer 29 and the core layer 30 on the uppermost insulating layer 25 are removed. At this time, the semiconductor layer 29 and the core layer 30 at the upper portion of the hole are also removed. Next, the cap layer 31 is formed so as to bury the upper portion of the hole.

Figure 8:
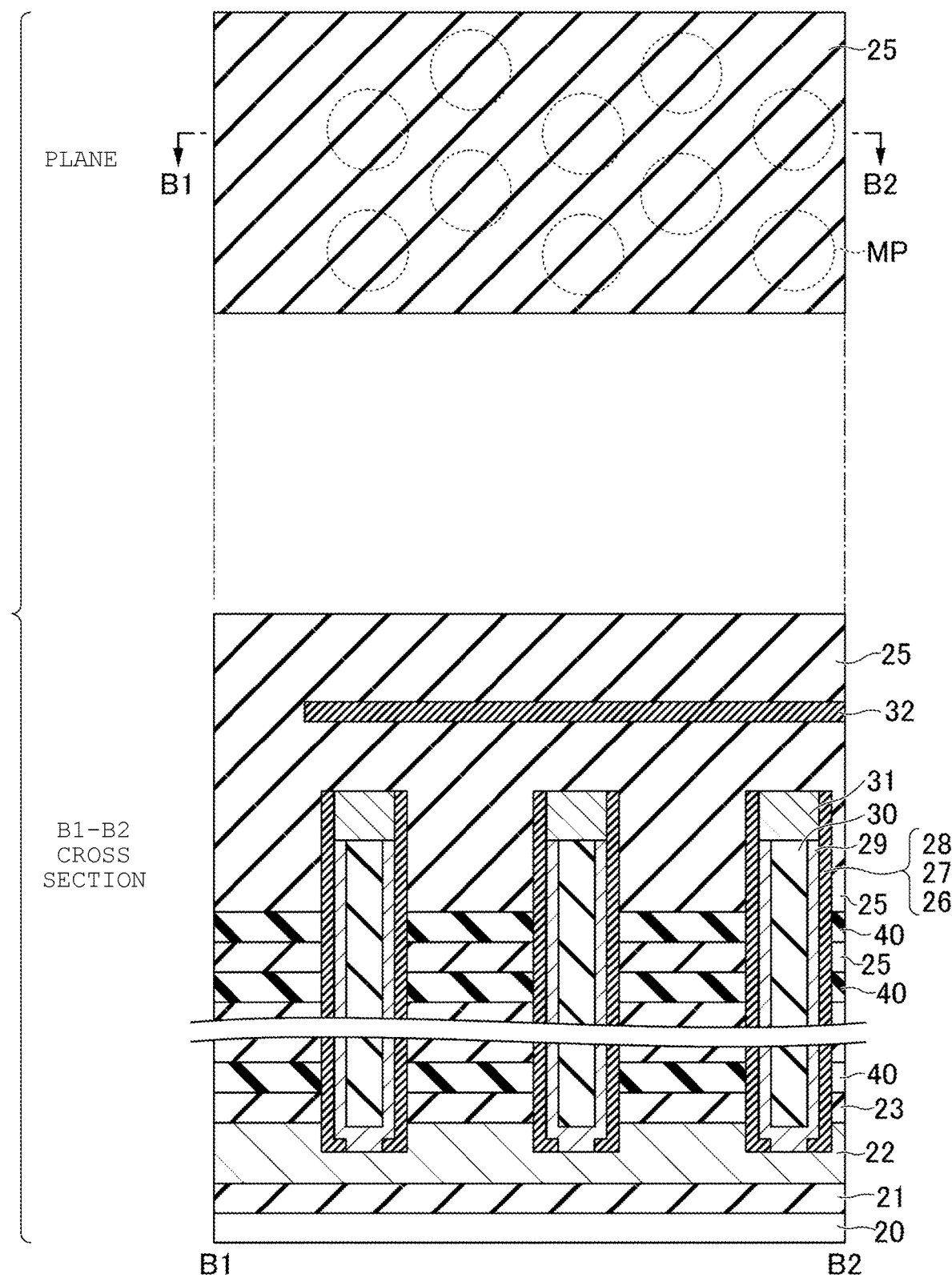

As illustrated in FIG. 8, after the insulating layer 25 is formed, the insulating layer 32 is formed so as to cover the upper surface of the memory pillar MP. At this time, the insulating layer 32 is removed in the region where the slit SLT is to be formed later. Next, the insulating layer 25 is formed on the insulating layer 32.

Figure 9:
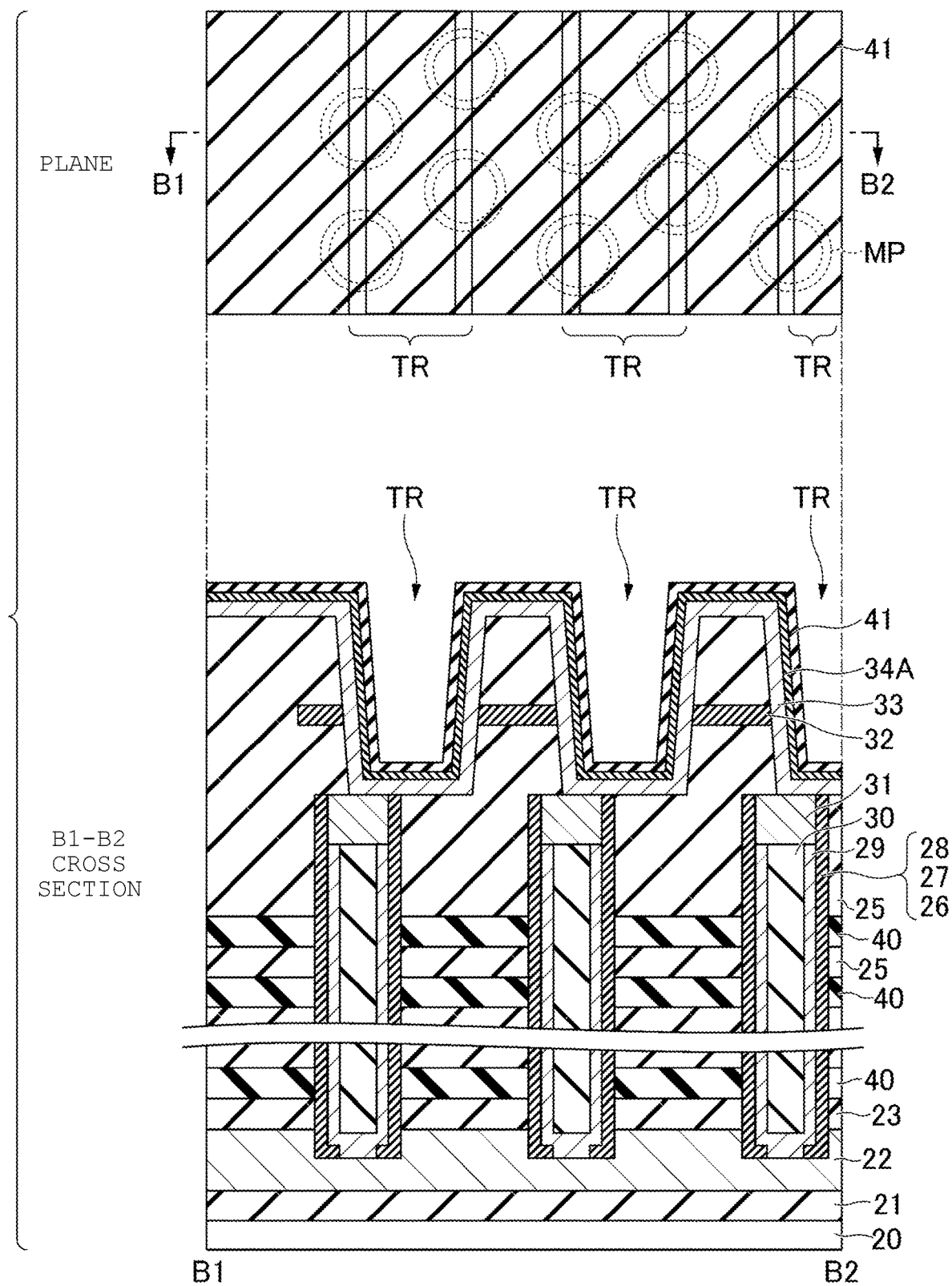

As illustrated in FIG. 9, the trench TR of which the bottom surface reaches the memory pillar MP is formed. At this time, by using, for example, the insulating layer 32 as an etching stopper, the trench TR may be processed in two steps to reduce the processing damage to the upper surface of the memory pillar MP. In the bottom portion of the trench TR, a portion of the upper surface of each of the memory pillars MP arranged in two rows in a zigzag manner is exposed.

Next, the semiconductor-containing layer 33, an insulating layer 34A, and an insulating layer 41 are sequentially stacked. The insulating layer 41 functions as, for example, a protective layer of the insulating layer 34A. For the insulating layer 41, for example, a material that has a high etch selectivity in wet etching as compared to the insulating layer 34A is used. The insulating layer 41 is made of, for example, SiN.

Figure 10:
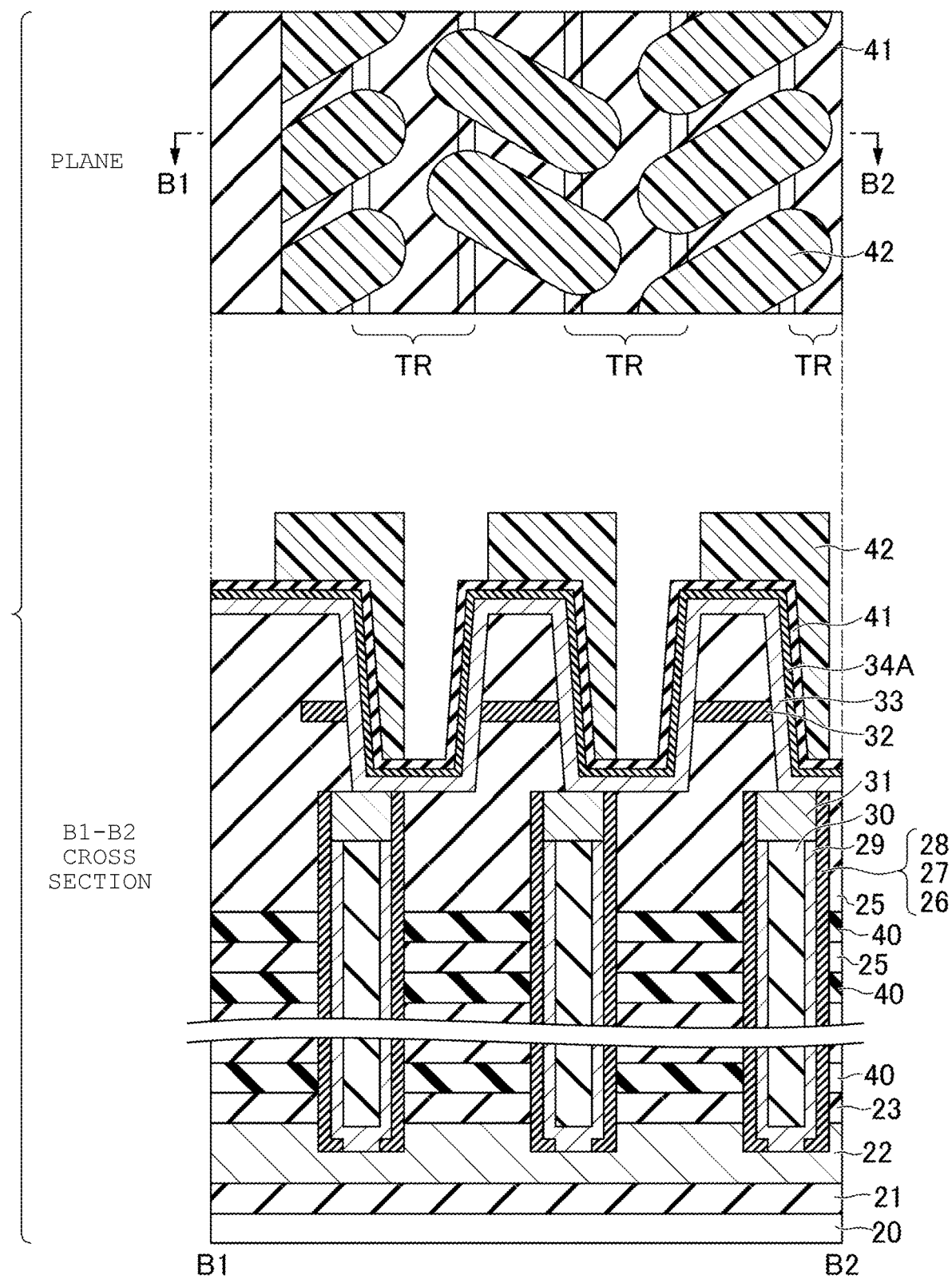

Next, as illustrated in FIG. 10, a mask pattern covering the upper portions of the two adjacent memory pillars MP is formed between the two trenches TR.

Figure 11:
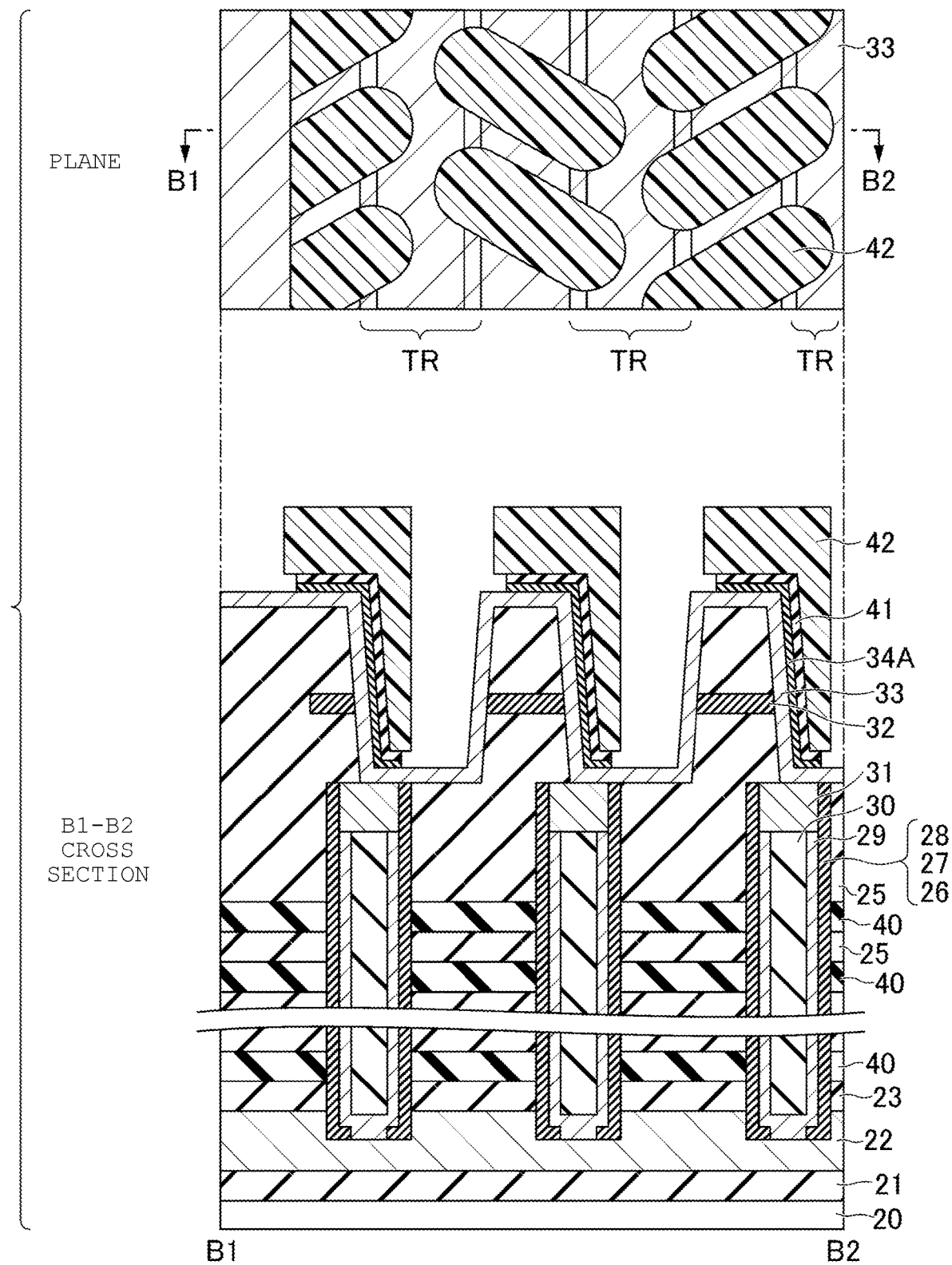

As illustrated in FIG. 11, for example, the insulating layer 34A and the insulating layer 41 in the region not covered with resist 42 are removed by chemical dry etching (CDE).

Figure 12:
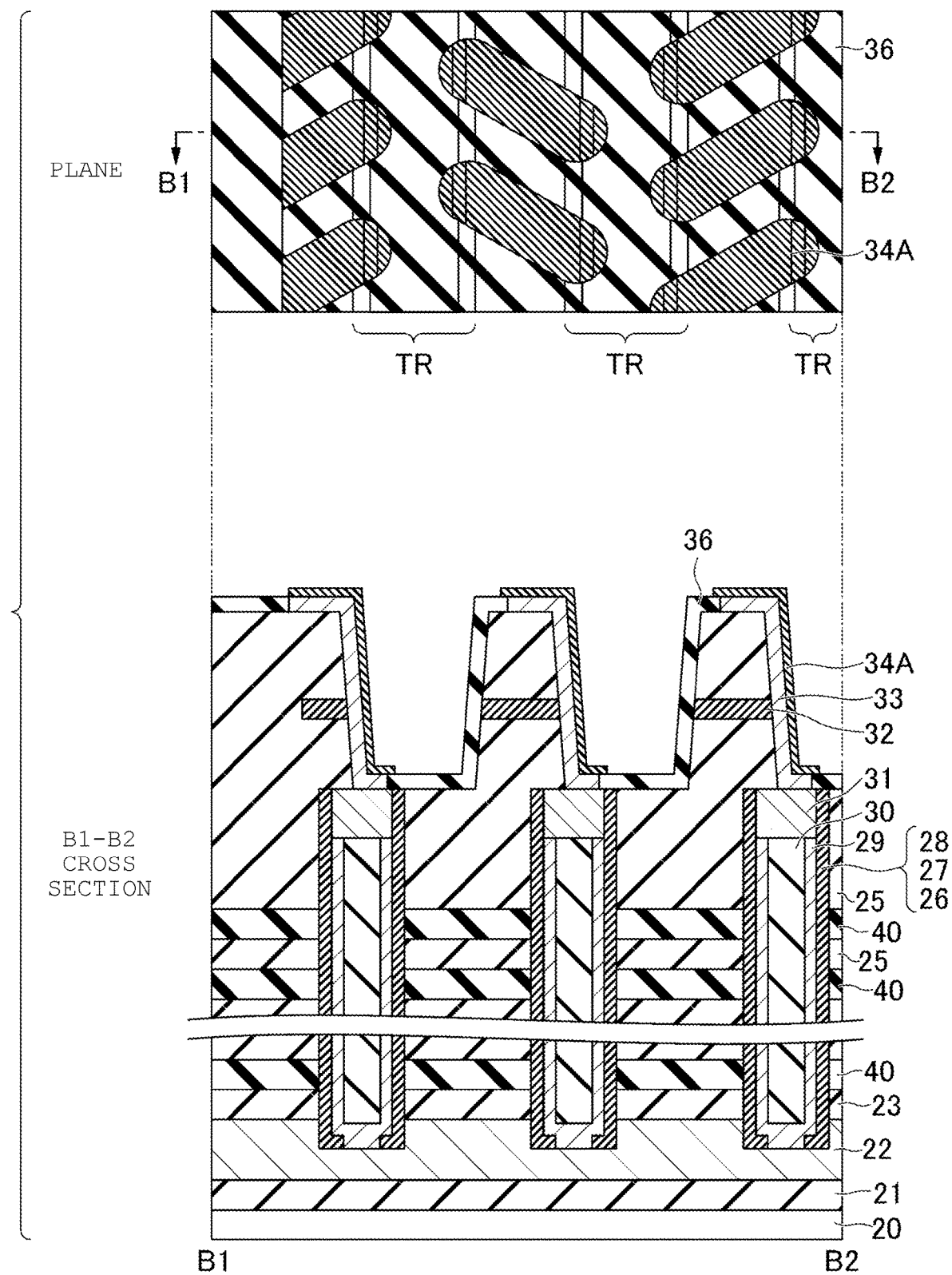

As illustrated in FIG. 12, after removing the resist 42, a portion of the semiconductor-containing layer 33 is oxidized to form the insulating layer 36. At this time, the semiconductor-containing layer 33 in the region of which surface is covered with the insulating layer 34A and the insulating layer 41 is not oxidized. Furthermore, an end region of the semiconductor-containing layer 33 of which surface is covered with the insulating layer 34A and the insulating layer 41 may be oxidized. Then, for example, the insulating layer 41 is removed by wet etching.

Figure 13:
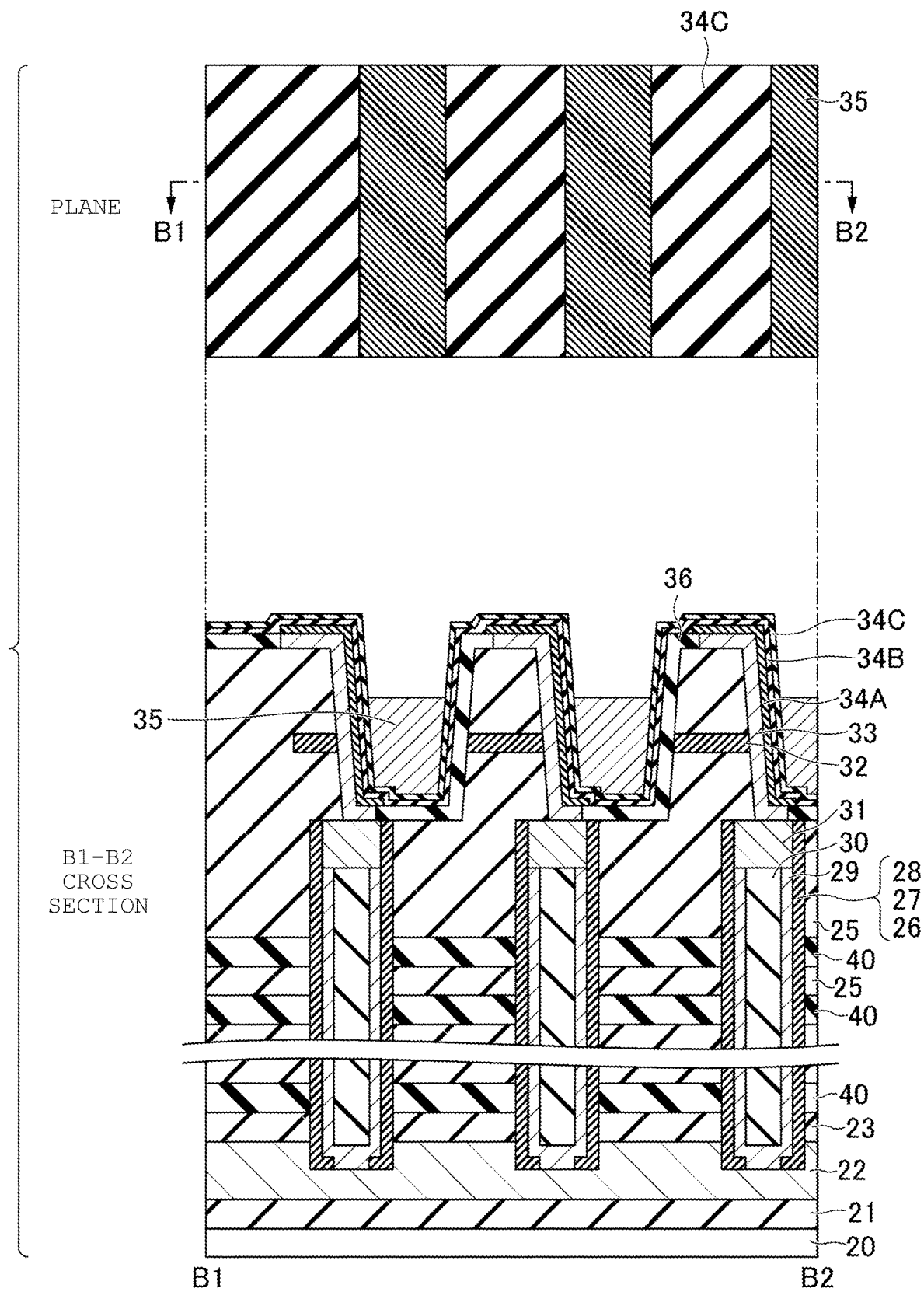

As illustrated in FIG. 13, an insulating layer 34B and an insulating layer 34C are stacked in this order on the insulating layers 34A and 36. The insulating layer 34B is made of, for example, silicon nitride, and the insulating layer 34C is made of, for example, silicon oxide. Then, after stacking the conductive layer in the trench TR, the wiring layer 35 is formed by etching back the unnecessary portion.

Figure 14:
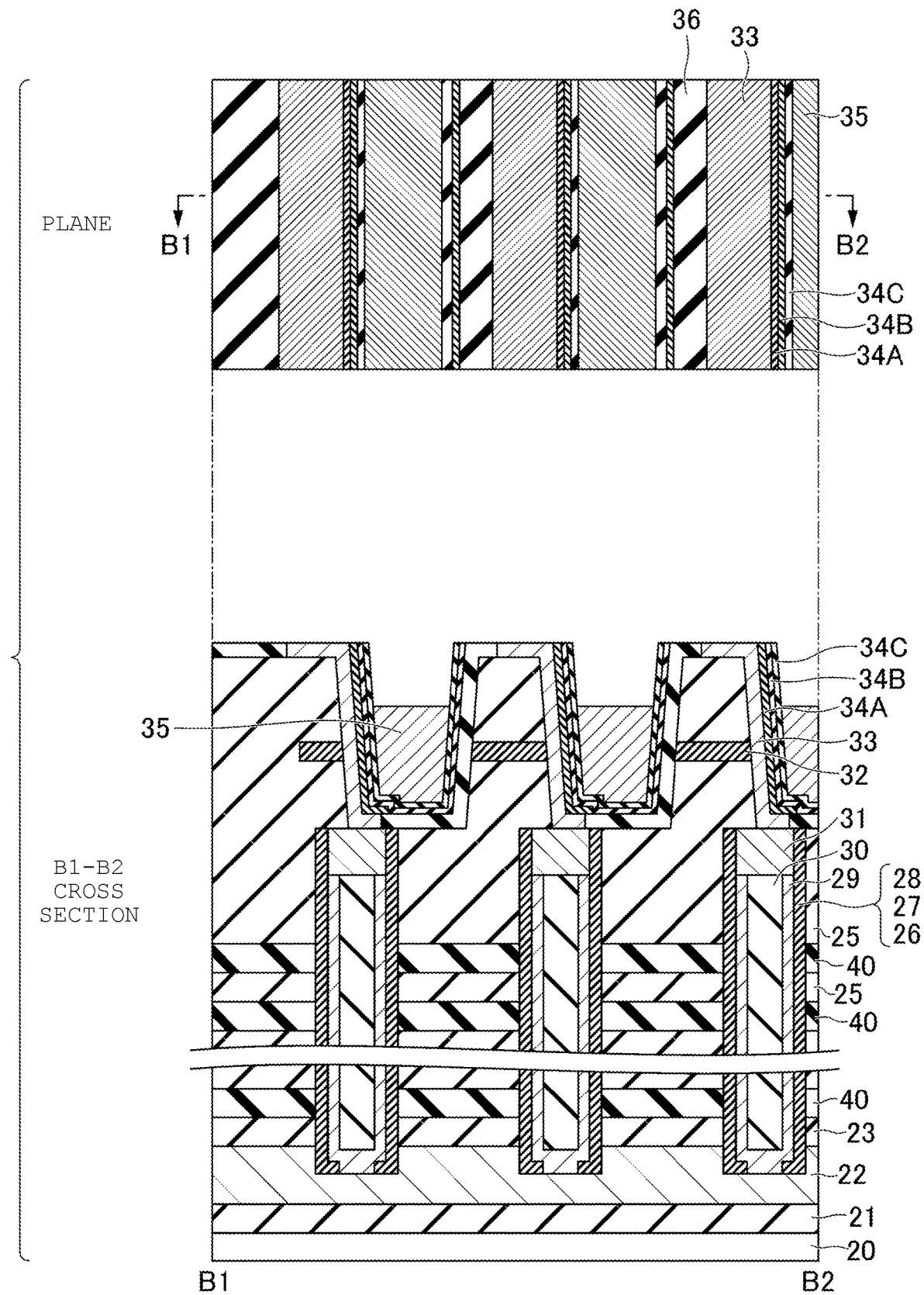

As illustrated in FIG. 14, the insulating layers 34A, 34B, and 34C stacked on the upper surface of the semiconductor-containing layer 33 are removed to expose the upper surface of the semiconductor-containing layer 33. A portion of each of the insulating layers 34A, 34B, and 34C is removed by, for example, chemical mechanical polishing (CMP). A semiconductor may be further selectively grown on the exposed semiconductor layer-containing layer 33 to increase the thickness of the semiconductor-containing layer 33.

Figure 15:
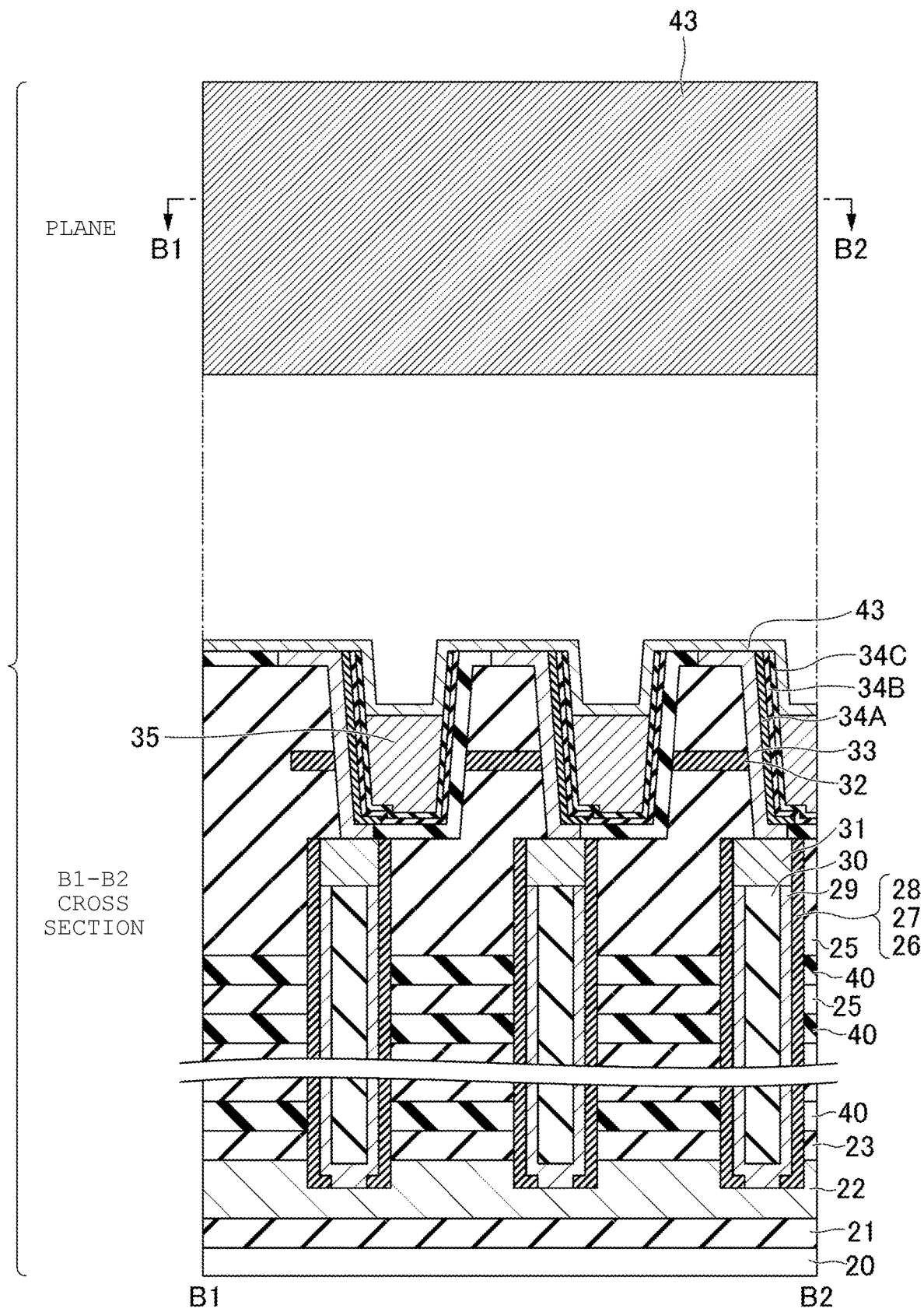

As illustrated in FIG. 15, a metal layer 43 is stacked on the upper surface of the stacked body. The metal layer is made of, for example, nickel. After stacking the metal layer 43, the semiconductor and the metal are combined on the upper surface of the semiconductor-containing layer 33 by heating the stacked body. For example, the exposed surface of the semiconductor-containing layer 33 is silicided. The process is referred to as a salicide process. When the wiring layer 35 is made of a semiconductor, the wiring layer 35 is also silicided at the same time. After that, the metal layer 43 that has not been silicided is removed.

Figure 16:
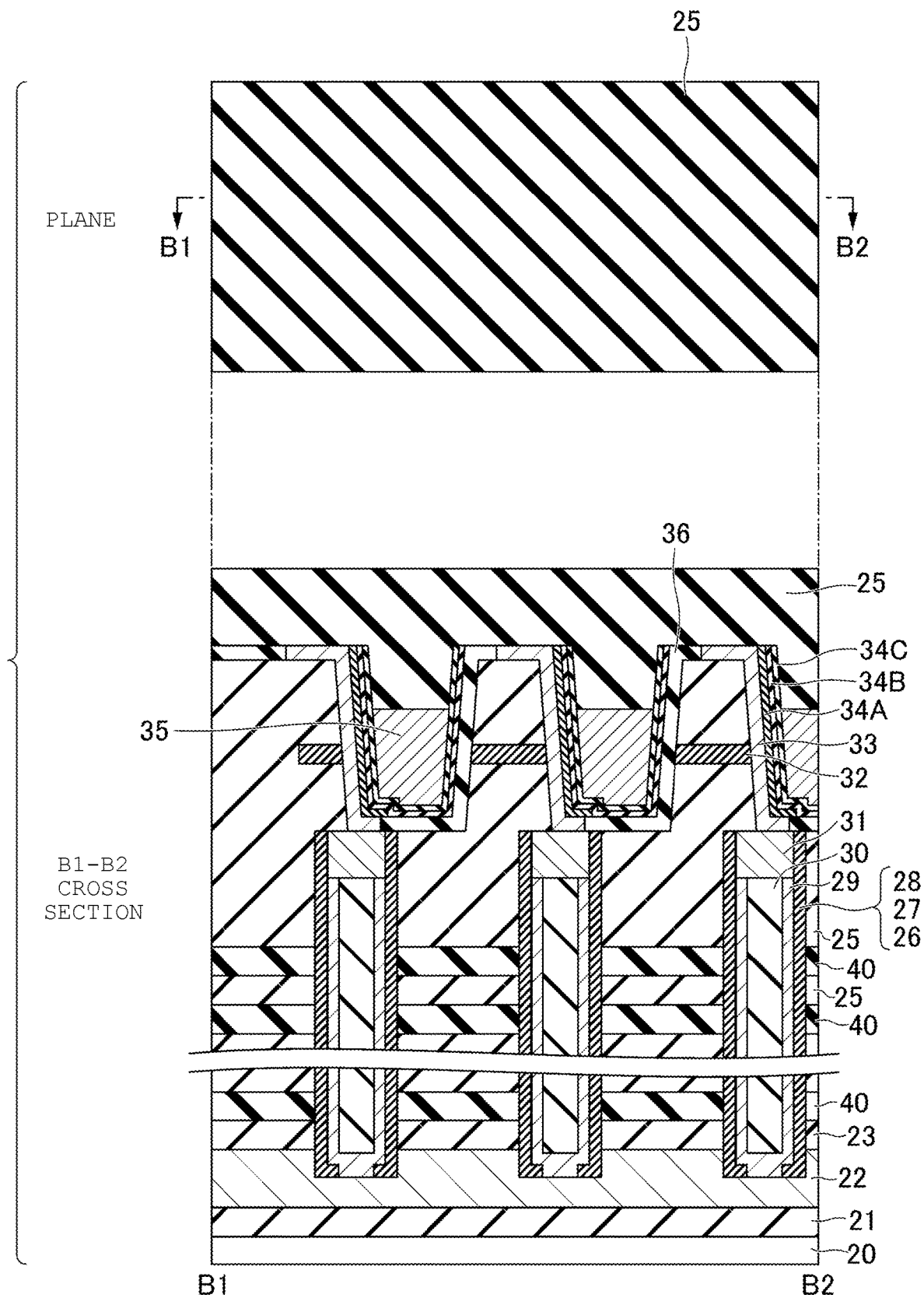

As illustrated in FIG. 16, the insulating layer 25 is formed on the upper surface 33cA of the semiconductor-containing layer 33. The insulating layers 34A, 34B, and 34C become the insulating layer 34.

Figure 17:
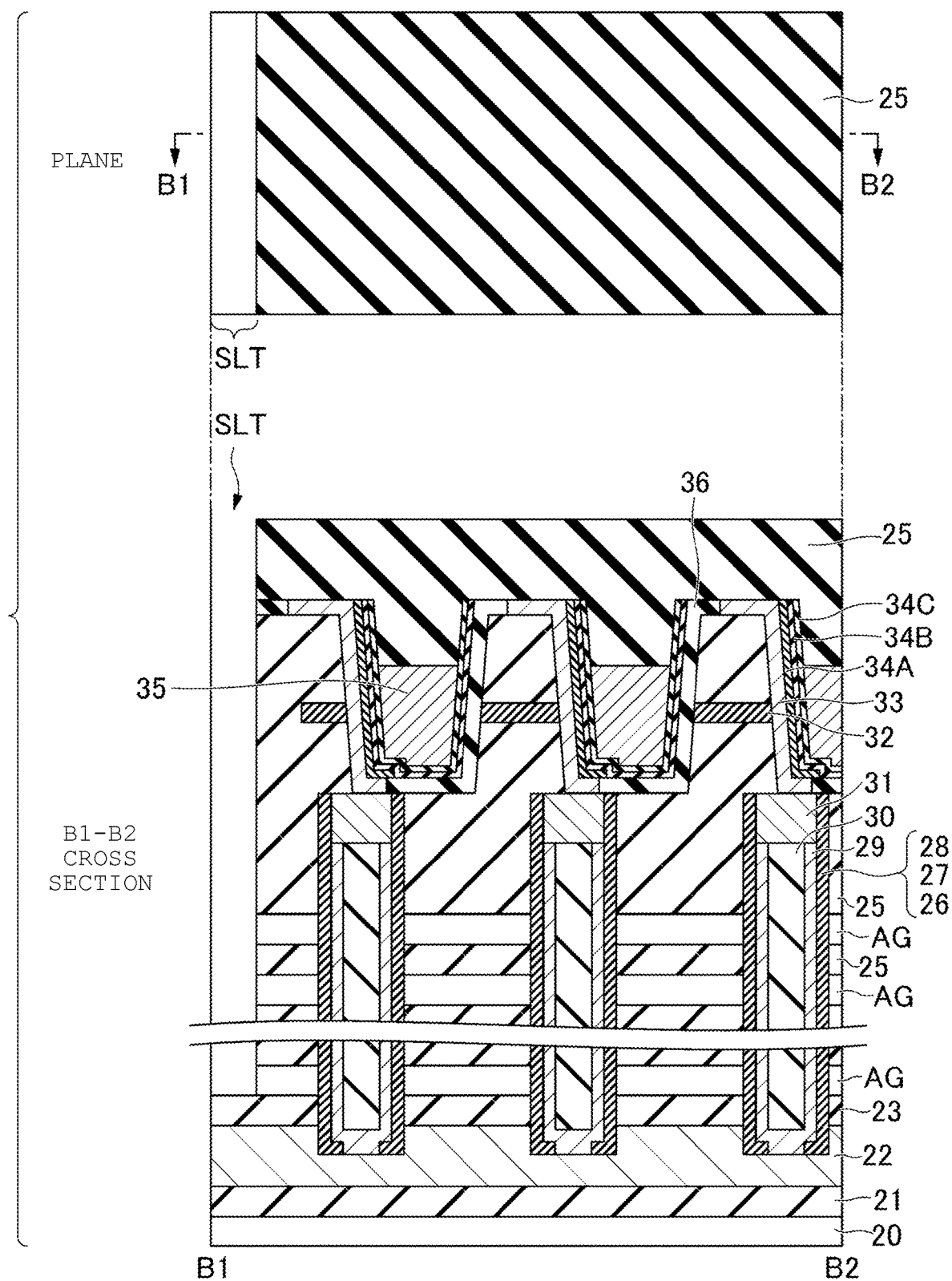

As illustrated in FIG. 17, after the slit SLT is processed, the sacrificial layer 40 is removed from the side surface of the slit SLT by wet etching to form an air gap AG.

Figure 18:
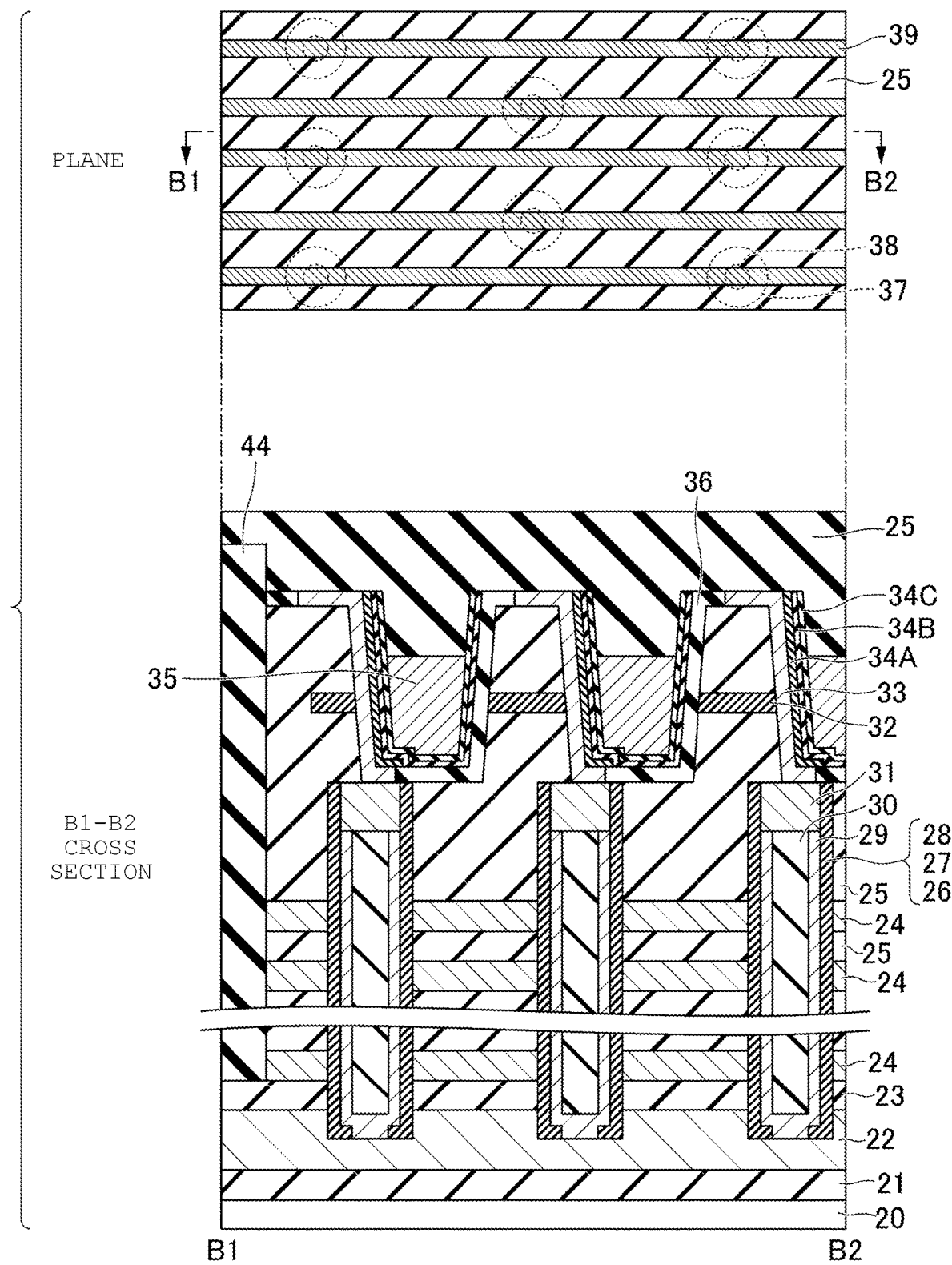

As illustrated in FIG. 18, next, after the air gap is buried by forming TiN and W, the TiN and the W formed in the slit SLT and on the uppermost insulating layer 25 are removed, and the wiring layer 24 is formed.

As illustrated in FIG. 18, next, the slit SLT is buried by the insulating layer 44. Next, the conductor 37 of which the bottom surface is in contact with the semiconductor-containing layer 33 is formed. Next, after the insulating layer 25 is formed, the conductor 38 and the wiring layer 39 are formed.

Through the above-described processes, the semiconductor storage device 1 is manufactured. The manufacturing processes illustrated herein are examples, and thus, other processes may be added between the processes or adopted. In addition, although the example in which the wiring layer 35 is silicided at the same time as the semiconductor-containing layer 33 has been described, the wiring layer 35 may be, for example, a stacked film of tungsten (W) or tungsten (W) and titanium nitride (TiN). In such a case, after reaching the state of FIG. 13, an insulating layer is stacked on the wiring layer 35 to bury the trench TR. After that, similarly to FIG. 14, the insulating layers 34A, 34B, and 34C stacked on the upper surface of the semiconductor-containing layer 33 are removed to expose the upper surface of the semiconductor-containing layer 33, and the semiconductor and the metal are combined with each other on the upper surface of the semiconductor-containing layer 33.

In the semiconductor storage device 1, the upper surface 33cA of the third layer 33c of the semiconductor-containing layer 33 contains a metal and is made of, for example, a silicide. The metal-containing region on the upper surface 33cA of the third layer 33c prevents the opening from penetrating the third layer 33c when the opening for forming the conductor 37 is formed. In addition, by combining the upper surface 33cA of the third layer 33c with the metal in advance (that is performing self-aligned silicidation), the contact resistance between the third layer 33c and the conductor 37 is reduced.

Modified Example 1

Figure 19:
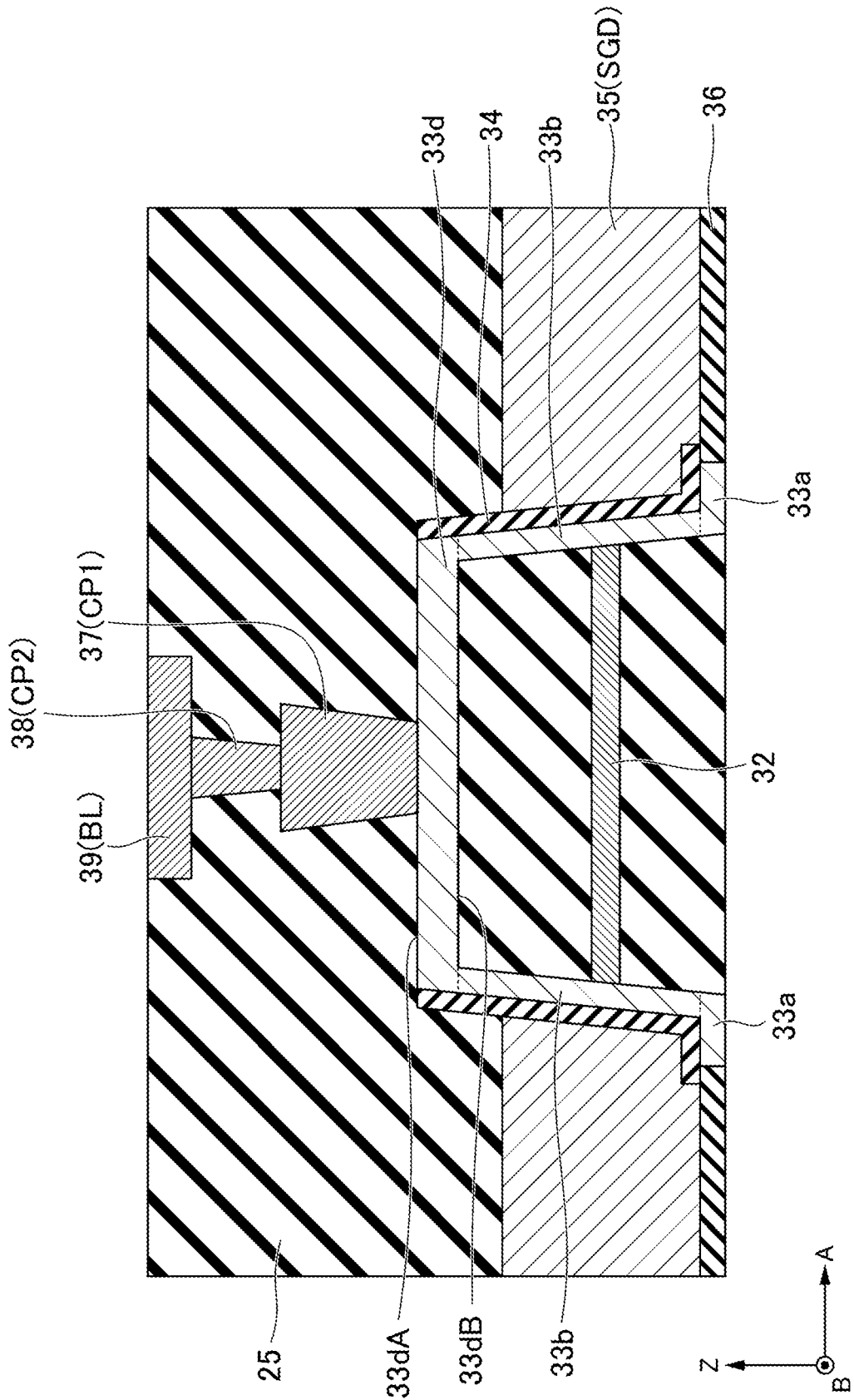
FIG. 19 is a cross-sectional view of a memory cell array of a semiconductor storage device according to a Modified Example 1.

A Modified Example 1 of the semiconductor storage device 1 will be described. FIG. 19 is a cross-sectional view of the memory cell array 10 in the semiconductor storage device 1 according to the Modified Example 1. FIG. 19 is an enlarged view of the semiconductor-containing layer 33. The Modified Example 1 has the same configuration as the semiconductor storage device 1 according to the first embodiment except for the differences described below.

The semiconductor-containing layer 33 has a first layer 33a, a second layer 33b, and a third layer 33d. The configuration of the third layer 33d is different from that of the third layer 33c of the semiconductor-containing layer 33 according to the first embodiment. In the third layer 33d, all the regions in the thickness direction contain metals. For example, the entire third layer 33d in the thickness direction is combined with a metal, and thus, for example, the entire third layer 33d is a full silicide in which the entire portions are silicided. The thickness of the third layer 33d is, for example, larger than the thickness 33b of the second layer, and the peripheral length of an upper surface 33dA of the third layer 33d is, for example, equal to or larger than the peripheral length of a lower surface 33dB.

The same effects as those described for the first embodiment can be obtained by Modified Example 1.

Modified Example 2

Figure 20:
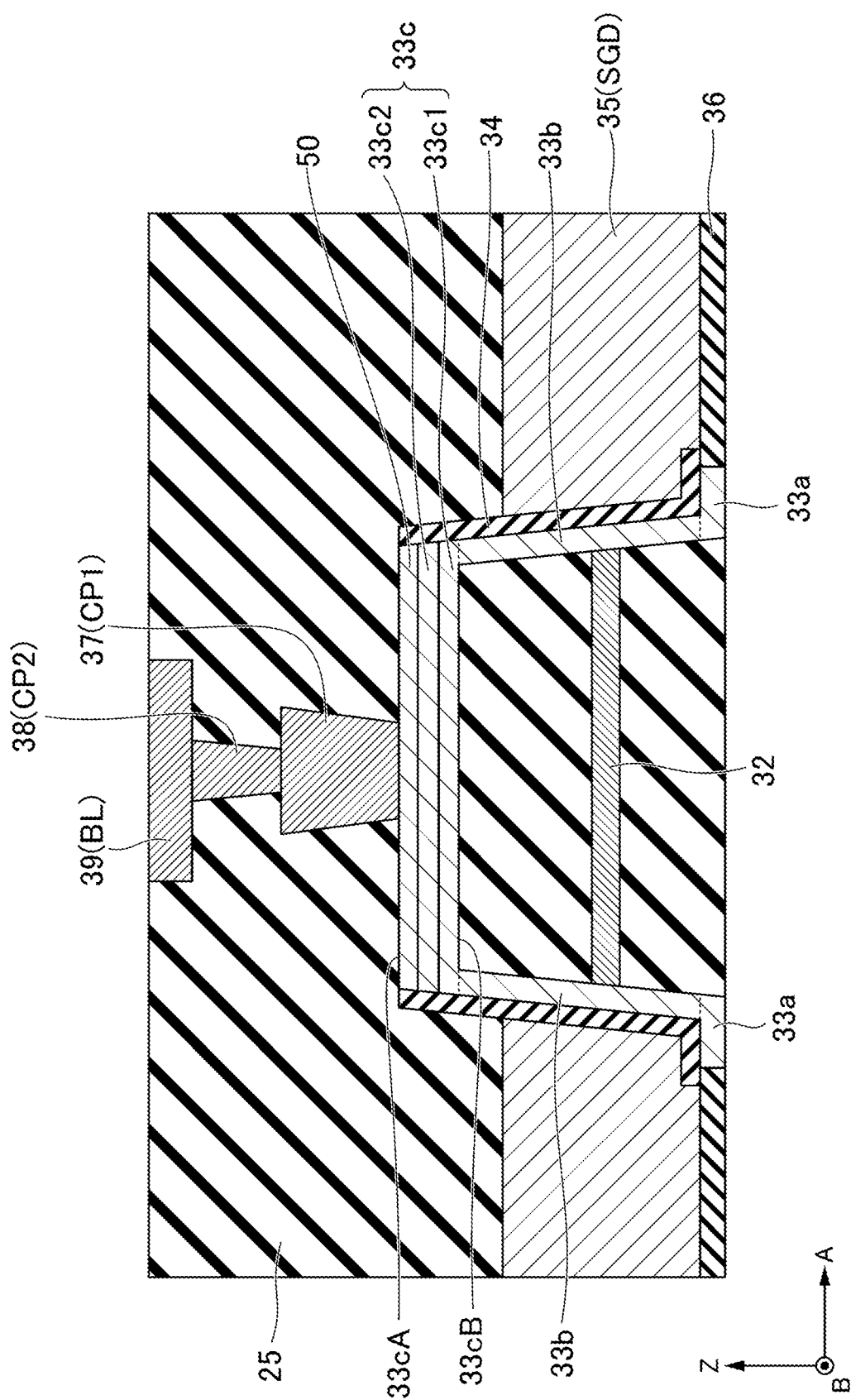
FIG. 20 is a cross-sectional view of a memory cell array of a semiconductor storage device according to a Modified Example 2.

A Modified Example 2 of the semiconductor storage device 1 will be described. FIG. 20 is a cross-sectional view of the memory cell array 10 in the semiconductor storage device 1 according to Modified Example 2. FIG. 20 is an enlarged view of the semiconductor-containing layer 33. The Modified Example 2 has the same configuration as the semiconductor storage device 1 according to the first embodiment except for the differences described below.

The semiconductor storage device according to the Modified Example 2 has a metal layer 50 on the upper surface 33cA of the third layer 33c of the semiconductor-containing layer 33. The metal layer 50 contains, for example, titanium, tantalum, and/or tungsten. As illustrated in FIG. 14, the metal layer 50 is formed by exposing the upper surface 33cA of the third layer 33c and, after that, performing selective growth on the exposed conductive surface. For the selective growth of the metal layer 50, for example, an area selective atomic layer deposition (ALD) method, an electroless plating method, or the like may be used.

The same effects described above for the first embodiment can be obtained the Modified Example 2. In addition, by having the metal layer 50, it is possible to further prevent the opening for forming the conductor 37 from penetrating the third layer 33c. In addition, titanium, tantalum, and/or tungsten used for the metal layer 50 are less likely to cause contamination in the subsequent processes as compared with nickel and cobalt used for silicidation. For example, when nickel and cobalt are mixed in an etching apparatus used for processing the insulating layer in subsequent processes, the nickel and the cobalt are difficult to clean, but the titanium, the tantalum, and the tungsten are easier to clean than the nickel and the cobalt.

Modified Example 3

Figure 21:
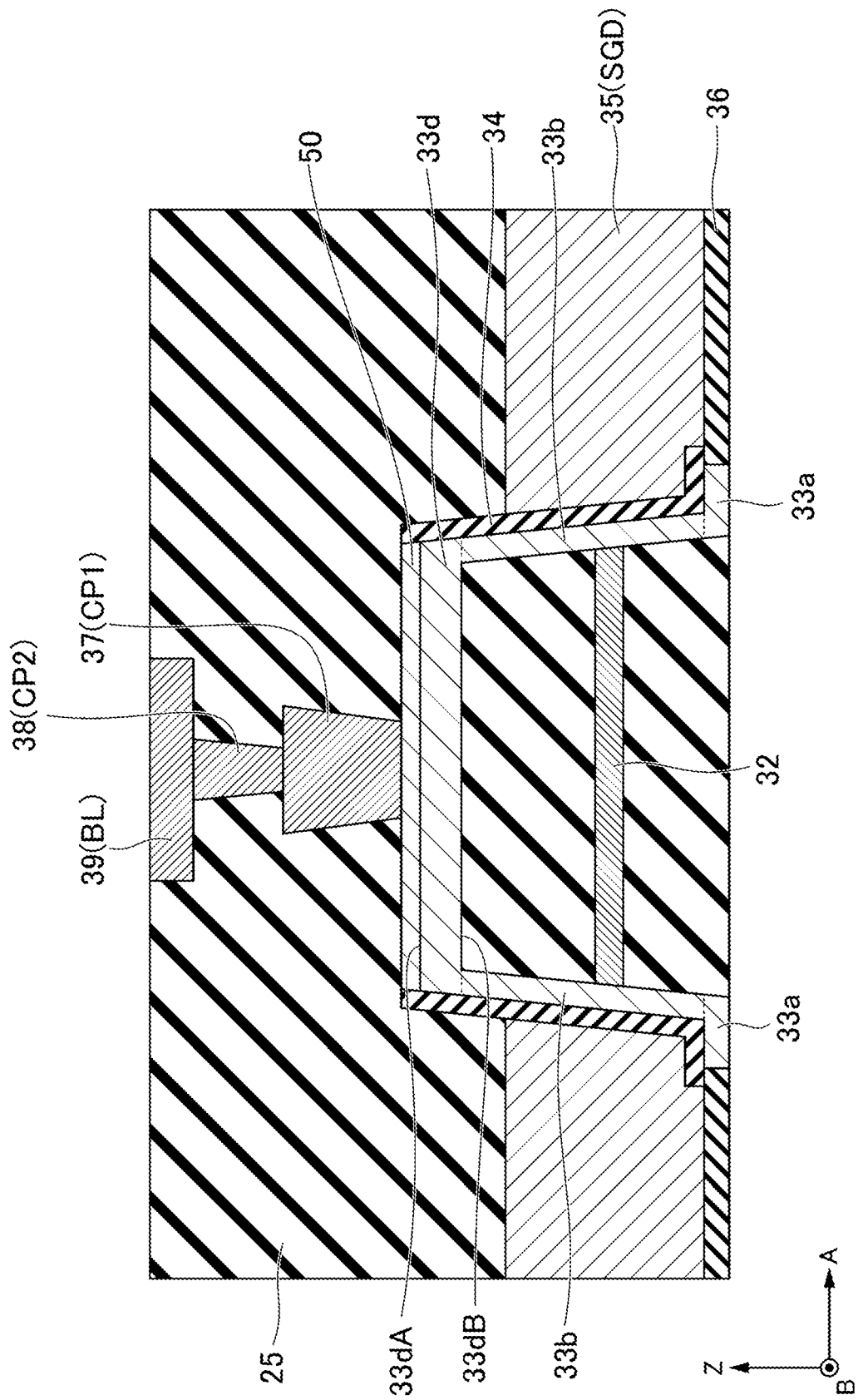
FIG. 21 is a cross-sectional view of a memory cell array of a semiconductor storage device according to a Modified Example 3.

A Modified Example 3 of the semiconductor storage device 1 will be described. FIG. 21 is a cross-sectional view of the memory cell array 10 in the semiconductor storage device 1 according to Modified Example 3. FIG. 21 is an enlarged view of the semiconductor-containing layer 33. The semiconductor memory according to Modified Example 3 has the same configuration as the semiconductor storage device 1 according to the first embodiment except for the differences described below.

The Modified Example 3 has the metal layer 50 on the upper surface 33dA of the third layer 33d described above for Modified Example 1. The metal layer 50 is otherwise the same as that of the Modified Example 2.

The same effects as those described for the first embodiment can be obtained by Modified Example 3.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a plurality of first wiring layers stacked along a first direction;
a first pillar including a first semiconductor layer and extending through the plurality of first wiring layers in the first direction;
a second wiring layer disposed above the first pillar in the first direction and extending along a second direction perpendicular to the first direction;
a semiconductor-containing layer including:
a first portion disposed on an upper end of the first pillar in the first direction,
a second portion contacting the first portion and formed alongside the second wiring layer, and
a third portion contacting an upper end of the second portion and extending along a third direction perpendicular to the first direction and crossing the second direction; and
a first insulating layer between each of the first and second portions of the semiconductor-containing layer and the second wiring layer, wherein
at least an upper surface of the third portion contains a metal, and
the third portion of the semiconductor-containing layer includes:
a first layer that contains either polysilicon or amorphous silicon and
a second layer that contains a silicide on the first layer.

2. The semiconductor storage device according to claim 1, further comprising:
a metal layer on the first layer of the third portion of the semiconductor-containing layer.

3. The semiconductor storage device according to claim 1, wherein a thickness of the third portion of the semiconductor-containing layer is larger than a thickness of the second portion of the semiconductor-containing layer.

4. The semiconductor storage device according to claim 1, wherein a peripheral length of an upper surface of the third portion of the semiconductor-containing layer is equal to or larger than a peripheral length of a lower surface of the third portion.

5. The semiconductor storage device according to claim 1, wherein the first pillar includes a cap layer at the upper end thereof, and the cap layer contacts the first semiconductor layer of the first pillar and the first portion of the semiconductor-containing layer.

6. The semiconductor storage device according to claim 1, further comprising:
a bit line extending along a fourth direction perpendicular to both the first and second directions above the third portion of the semiconductor-containing layer and electrically connected to the third portion of the semiconductor-containing layer.

7. A semiconductor storage device comprising:
a plurality of first wiring layers stacked along a first direction;
a first pillar including a first semiconductor layer and extending through the plurality of first wiring layers in the first direction;
a second wiring layer disposed above the first pillar in the first direction and extending along a second direction perpendicular to the first direction;
a semiconductor-containing layer including:
a first portion disposed on an upper end of the first pillar in the first direction,
a second portion contacting the first portion and formed alongside the second wiring layer, and
a third portion contacting an upper end of the second portion and extending along a third direction perpendicular to the first direction and crossing the second direction;
a first insulating layer between each of the first and second portions of the semiconductor-containing layer and the second wiring layer; and
a first conductor electrically connected to an upper surface of the third portion of the semiconductor-containing layer and extending along the first direction, wherein
a peripheral length of the upper surface of the third portion is larger than a peripheral length of an upper surface of the first conductor, and
at least an upper surface of the third portion contains a metal.

8. A semiconductor storage device comprising:
a plurality of first wiring layers stacked along a first direction;
a first pillar including a first semiconductor layer and extending through the plurality of first wiring layers in the first direction;
a second wiring layer disposed above the first pillar in the first direction and extending along a second direction perpendicular to the first direction;
a semiconductor-containing layer including:
a first portion disposed on an upper end of the first pillar in the first direction, a second portion contacting the first portion and formed alongside the second wiring layer, and a third portion contacting an upper end of the second portion and extending along a third direction perpendicular to the first direction and crossing the second direction;

a first insulating layer between each of the first and second portions of the semiconductor-containing layer and the second wiring layer;

a second pillar extending along the first direction through the first wiring layers and a third wiring layer formed above the second pillar and extending along the second direction, wherein the semiconductor-containing layer further includes:

a fourth portion disposed on an upper end of the second pillar in the first direction, and a fifth portion contacting the third and fourth portions and extending along the third wiring layer between the third and fourth portions, and at least an upper surface of the third portion contains a metal.

* * * * *